United States Patent
Ezaki et al.

(10) Patent No.: US 6,996,001 B2
(45) Date of Patent: Feb. 7, 2006

(54) MAGNETIC MEMORY DEVICE, WRITE CURRENT DRIVE CIRCUIT, AND WRITE CURRENT DRIVE METHOD

(75) Inventors: Joichiro Ezaki, Tokyo (JP); Yuji Kakinuma, Tokyo (JP); Keiji Koga, Tokyo (JP)

(73) Assignee: TDK Corporation, Tokyo (JP)

( * ) Notice: Subject to any disclaimer, the term of this patent is extended or adjusted under 35 U.S.C. 154(b) by 102 days.

(21) Appl. No.: 10/717,595

(22) Filed: Nov. 21, 2003

(65) Prior Publication Data

US 2004/0114443 A1    Jun. 17, 2004

(30) Foreign Application Priority Data

Nov. 22, 2002  (JP)  .............................. 2002-339932

(51) Int. Cl.
*G11C 11/14*    (2006.01)

(52) U.S. Cl. ........................................ 365/171; 365/173
(58) Field of Classification Search ............... 365/171, 365/173, 158
See application file for complete search history.

(56) References Cited

U.S. PATENT DOCUMENTS

| | | | |
|---|---|---|---|
| 5,732,016 A | 3/1998 | Chen et al. | |
| 5,761,009 A * | 6/1998 | Hughbanks et al. | ........ 360/323 |
| 5,894,447 A | 4/1999 | Takashima | |
| 6,269,027 B1 | 7/2001 | Hurst, Jr. et al. | |
| 6,515,838 B1 * | 2/2003 | Gill | ........................ 360/324.12 |
| 6,881,497 B2 * | 4/2005 | Coffey et al. | ................ 428/611 |

FOREIGN PATENT DOCUMENTS

WO    WO 2004/049344    6/2004

OTHER PUBLICATIONS

R. Scheuerlein, et al., "A 10ns Read and Write Non-Volatile Memory Array Using a Magnetic Tunnel Junction and FET Switch in each Cell", IEEE International Solid-State Circuits Conference, Session 7, Paper 7.2, 2000, pp. 128-129.
U.S. Appl. No. 10/669,561, filed Sep. 25, 2003, Ezaki et al.
U.S. Appl. No. 10/717,595, filed Nov. 21, 2003, Ezaki et al.

* cited by examiner

*Primary Examiner*—Michael Tran
(74) *Attorney, Agent, or Firm*—Oblon, Spivak, McClelland, Maier & Neustadt, P.C.

(57) ABSTRACT

A magnetic memory device includes a magneto-resistance effect element including a magnetic sensitive layer whose magnetization direction changes according to an external magnetic field; a write line to which a write current is supplied to apply an external magnetic field to the magnetic sensitive layer; and a write current drive circuit including a current direction control section for controlling the direction of the write current in the write line and a current amount control section for controlling the amount of the write current in the write line to a constant value.

39 Claims, 26 Drawing Sheets

MAGNETIC MEMORY DEVICE, WRITE CURRENT DRIVE CIRCUIT, AND WRITE CURRENT DRIVE METHOD

BACKGROUND OF THE INVENTION

This invention relates to a magnetic memory device implemented using a magneto-resistance effect element containing a ferromagnetic substance for controlling the magnetization direction of the ferromagnetic substance, thereby writing and storing information, and a write current drive circuit and a write current drive method applied to the magnetic memory device.

Hitherto, volatile memory such as DRAM or SRAM has been used as general-purpose memory used with an information processing apparatus such as a computer or a mobile communication apparatus. Unless a current is always supplied to the volatile memory, all information stored in the memory is lost. Thus, a nonvolatile memory needs to be separatelly provided for storing information, and flash EEPROM, a hard disk unit, or the like is used. As information processing is speeded up, it is an important problem to speed up the nonvolatile memory. From another aspect of information apparatus development intended for recent ubiquitous computing, there is a high demand for developing high-speed nonvolatile memory as a key device.

MRAM (Magnetic Random-Access Memory) is known as an effective art for speeding up nonvolatile memory. The MRAM has storage cells implemented as magnetic elements, arranged like a matrix. The current commercially practical MRAM uses GMR (Giant Magneto-Resistive). The GMR is a phenomenon in which in a layered product having two ferromagnetic layers disposed with mutual easy axes of magnetization made in the same direction, the layers deposited on each other, the resistance value of the layered product becomes the minimum if the magnetization directions of the ferromagnetic layers are parallel along the easy axis of magnetization; the maximum if antiparallel. Each storage cell stores information as binary information "0" or "1" corresponding to either of the two states and the resistance difference related to the information is detected as current or voltage change, whereby the information is read. In the actual GMR element, two ferromagnetic layers are deposited with a nonmagnetic layer therebetween, and include a fixed layer with the magnetization direction fixed and a free layer (magnetic sensitive layer) with the magnetization direction changeable according to an external magnetic field.

In a magnetic element using TMR (Tunneling Magneto-Resistive), the resistance change rate can be made exceptionally large as compared with the GMR element. The TMR is a phenomenon in which in two ferromagnetic layers (a fixed layer with the magnetization direction fixed and a magnetic sensitive layer with the magnetization direction changeable, namely, a free layer) deposited with an extremely thin insulating layer therebetween, the tunnel current value flowing through the insulating layer changes according to the relative angle between their magnetization directions. That is, if the magnetization directions are parallel, the tunnel current becomes the maximum (the resistance value of the element becomes the minimum); if the magnetization directions are antiparallel, the tunnel current becomes the minimum (the resistance value of the element becomes the maximum). As a specific example of the TMR element, a layered structure of CoFe/Aloxide/CoFe is known, and its resistance change rate reaches 40% or more. The TMR element has high resistance and is easily matched with a semiconductor device such as a metal oxide semiconductor field effect transistor (MOSFET). From such advantages, TMR-MRAM can be easily put-into high output as compared with GMR-MRAM and enhancement of the storage capacity and the access speed is expected.

In both GMR-MRAM and TMR-MRAM, information is written according to a similar technique. That is, a current is allowed to flow into a conductor wire for inducing a magnetic field, and the magnetization direction of the free layer is changed by the current magnetic field. Accordingly, the relative magnetization directions between the ferromagnetic layers become parallel or antiparallel and the corresponding binary information is stored.

For example, TMR-MRAM in a related art has the following configuration: As shown in FIG. 26, each write word line 202 (and each read word line 203) and each write/read bit line 201 are disposed so as to be orthogonal to each other. Here, the write wires are collectively called write lines. Although not shown, in each intersection area, a TMR element 207 is disposed so as to be sandwiched therebetween, forming a storage cell. FIG. 27 shows the general configuration of the TMR element. Thus, the TMR element 207 is implemented as a layered product made up of a first magnetic layer 204 of a fixed layer, a tunnel barrier layer 205, and a second magnetic layer 206 of a free layer. The layered product is provided on one side with the bit line 201 and on an opposite side with the read word line 203 and the write word line 202.

In the described MRAM, storing information in one storage cell is controlling the magnetization direction of the second magnetic layer 206 of the storage cell to the direction responsive to the information. This is performed by allowing a current to flow into the bit line 201 and the write word line 202 placed so as to sandwich the storage cell into which the information is to be written. A magnetic field is induced into each current flowing into the write line and the magnetization direction of the second magnetic layer 206 changes according to the resultant magnetic field.

At the time, a write current is supplied into the write line from a write current drive circuit (current drive). FIG. 28 shows a configuration example of the current drive applied to the MRAM in the related art (referring to non-patent document "ISSCC 2000 Digest paper TA7.2"). The circuit is made up of a part for generating a pulse whose shape is defined based on the necessary write current value and a part for selecting the write line to write and sending the generated pulse thereto. Here, a reference signal generation section 211, a positive amplifier 213A, a negative amplifier 213B, a current direction selection section 214, a timing block 216, and a pulse width control section 217 correspond to the former part. A write line selection section 219 corresponds to the latter. The timing block 216 performs timing control of the pulse width control section 217 of a time switch with a timing signal input to a write signal input line 215 as a trigger. The write line selection section 219 selects the write line to which a pulse is to be supplied in response to a decode signal input to an address decode line 218; generally it is made up of a large number of switching elements corresponding to the write lines. One end of each write line is connected to the write line selection section 219 and another end of the write line is grounded.

In the circuit, a data signal line 212 (Din) is divided into two branches and both positive and negative amplification signals are generated by the positive amplifier 213A and the negative amplifier 213B at the branches and either of the amplification signals is selected by the current direction selection section 214. A reference signal is input from the reference signal generation section 211 to th e positive amplifier 213A and the negative amplifier 213B for adjusting the magnitude of the input signal to the reference value. The data signal is a high or low digital signal representing write data. In the circuit portion, for example, a high signal is simply amplified by the positive amplifier 213A, but a low signal is inverse-amplified to a negative-potential pulse by the negative amplifier 213B (amplified signal is selected); consequently, either of the positive and negative pulses each having the reference value as the magnitude is generated in response to the data signal. This pulse is adjusted to a predetermined pulse width responsive to the necessary current amount in the pulse width control section 217 to produce a write pulse. The write pulse is supplied through the write line selection section 219 to the write line responsive to the decode signal. At this time, if a positive write pulse is applied to the write line, a current flows through the write line toward ground; if a negative write pulse is applied to the write line, a current flows from ground toward the pulse supply end side.

Thus, in the related art, first the pulse shape and sign are adjusted, whereby a write pulse to supply any desired current amount in a predetermined direction of the write line is generated and then is supplied to the write line. FIG. 29A shows functionally the current drive in the related art. A constant current control section 300 represents a circuit element having a function of controlling the write current amount to a constant value in the described current drive including the reference signal generation section 211 (usually, the reference signal generation section 211 is insufficient to control the pulse height with accuracy and thus a circuit for finely adjusting the pulse voltage value is added).

The conventional art as mentioned above is shown in the non-patent document "ISSCC 2000 Digest paper TA7.2".

However, in the actual MRAM, the resistance value varies from one write line to another. The resistance variations occur if the wiring length or shape differs in response to the position of each write line or because of a manufacturing error, etc. In the current drive in the related art, the write current once supplied to the write line is not controlled and thus the actually flowing current amount varies from one write line to another in response to the resistance value; this is a problem. That is, no matter how the current drive in the related art can control the write pulse with high accuracy, it does not include a function of adjusting the supplied current amount in response to the resistance value for each write line and thus the effect of the resistance variations cannot be removed and it is difficult to stably supply a constant current to the write line.

In the MRAM, a magnetic field for write is a current magnetic field induced to a write current and therefore the write state in the element (magnetization state) is determined by the strength of the magnetic field, namely, the magnitude of the write current. Thus, if the write current value is not constant, information cannot be stored in a stable state or cannot be read stably; it is possible to hinder operation stability.

As a technique of controlling the supplied current amount in response to the resistance value of each write line, for example, it is possible to control the current value constant downstream of the write current for making constant the current amount flowing into the whole write line. This means that the constant current control section 300 is placed on the ground side of the write line, as shown in FIG. 29B. However, the normal constant current circuit is a circuit using band gap reference made up of a transistor, a diode, etc., in which case the current direction is limited to one direction and it becomes impossible to allow a current to flow into one write line in both directions. If an attempt is made to allow a current to flow into the write circuitry in both directions, two write lines must be bundled and circuitry must be placed symmetrically as shown in FIG. 29C; however, it is not realistic because both the circuit structure and control become complicated. It may be said that controlling the write current in both directions is an indispensable condition in the current drive of the MRAM, and controlling the write current to a constant value must be accomplished after the condition is satisfied. However, it is not easy to realize a circuit for coping with both, and an effective solution technique is not yet proposed.

The current drive in the related art usually is built with CMOS (Complementary MOS). The CMOS has a feature of digital switching operation; it is well fitted to a logic section such as the current direction selection section 214 and a switch such as the write line selection section 219, but the circuit portion corresponding to the constant current control section 300 is an analog circuit and therefore it is difficult to construct the current drive with CMOS. Essentially, the MOSFET is a voltage control element. Therefore, in the current drive in the related art of the CMOS circuit, the direct control target is voltage and the current value must be controlled indirectly as the voltage value and the width of an input pulse are controlled; current control in the essential sense has not been performed. It is known that MOS elements involve comparatively large characteristic variations caused by manufacturing variations of the film thickness of a gate oxide film, etc. Thus, it is feared that the pulse shape may vary from one write line to another because of the effect of the characteristic variations.

Further, there is a problem of enlarging the circuit scale of the current drive as heavy use of CMOS is made. In addition, a circuit using band gap reference, for example, a current mirror circuit, etc., is built in the portion corresponding to the constant current control section 300, and the area of the current drive in the related art on a memory chip is ineegligibly large. Since the circuit configuration itself is also complicate, a simplifying technique is demanded.

SUMMARY OF THE INVENTION

It is therefore an object of the invention to provide a magnetic memory device, a write current drive circuit, and a write current drive method for making it possible to bidirectionally switch the flow direction of a write current of a constant amount for supplying the write current to a write line.

According to the invention, there is provided a magnetic memory device including a magneto-resistance effect element including a magnetic sensitive layer whose magnetization direction changes according to an external magnetic field; a write line to which a write current is supplied to apply an external magnetic field to the magnetic sensitive layer; and a write current drive circuit including a current direction control section for controlling the direction of the write current in the write line and a current amount control section for controlling the amount of the write current in the write line to a constant value.

In the magnetic memory device, the write current drive circuit supplies the write current to the write line. At the time, the current direction control section controls the direction of the write current in the write line and the current amount control section controls the magnitude of the write current in the write line so as to always become constant. The expression "controlling the amount of the write current to a constant value" in the invention is used to mean constant current control of setting the magnitude of the write current to a constant value throughout the write line from flowing into one end of the write line to flowing out from an opposite end rather than controlling of the amount of the write current before flowing into the write line or at the inflow end.

Preferably, the current direction control section selects one of both ends of the write line to which current is to be supplied as an inflow side of the write current and the other as an outflow side, thereby controlling the direction of the write current. Although the current direction control section can also always control the current direction to either direction, the current inflow and outflow ports can also be switched at both ends of the write line, thereby allowing the current to flow bidirectionally.

Further, preferably the current direction control section bidirectionally controls the direction of the write current in response to an input write data signal. That is, the direction of the write current is switched bidirectionally in response to the data signal and such a write current is used to invert magnetization of the magnetic sensitive layer to the direction responsive to the data signal, thereby writing the information corresponding to the data signal. The term "information" mentioned here refers to binary information generally represented by "0" or "1" in the input/output signal to/from the magnetic memory device or high or low based on the current value or the voltage value or the like, and the current value or the voltage value itself corresponding to the information is referred to as data signal.

Preferably, the write line is connected at both ends to the write current drive circuit. The control of the current direction control section for selecting one of both ends of the write line as the current inflow end and the other as the outflow side is carried out for both ends of the write line actually connected to the write current drive circuit. In this case, if the write line itself is shaped like a letter U, both ends of the write line are placed near to each other. The expression "connected" in the magnetic memory device of the invention refers to at least an electrically connected state and need not necessarily be "physically directly connected."

More specifically, preferably the current direction control section includes a first differential switch pair including a first current switch and a second current switch being provided corresponding to both ends of the write line for operating so as to become an opposite open/closed state to each other; and a second differential switch pair including a third current switch and a fourth current switch being provided corresponding to the first current switch and the second current switch for operating so as to become an opposite open/closed state to each other. The first differential switch pair has a function of selecting one of both ends of the write line as the inflow side of the write current and the second differential switch pair has a function of selecting the other as the outflow side of the write current. The open/closed state (on/off state) in a general switching element assumes the case where a conduction state (or a state in which the flowing current amount is equal to or greater than the threshold value) is the on state and a substantial shutoff state in which almost no current is allowed to flow (or a state in which the flowing current amount is less than the threshold value) is the off state. In this case, the on state and the off state are stationarily defined and each state can be determined digitally. The open state (off state) and the closed state (on state) of the current switch in the invention include the two states. In addition, the concept also contains the case where, of two relative states occurring at the differential operation time of the current switches as a differential switch pair, the state in which more current is allowed to flow is the on state and the state in which less current is only allowed to flow is the off state.

In the current direction control section, the first current switch and the second current switch of the first differential switch pair become opposite open/closed state (on/off state) to each other. Of both ends of the write line, the side where the corresponding current switch is on conducts and a current is allowed to flow; whereas, the side where the corresponding current switch is off is shut off and no current is allowed to flow. Thus, of both ends of the write line, the side controlled by the current switch which is on, of the first differential switch pair is selected as the write current inflow side. In the second differential switch pair, the third current switch is provided corresponding to one end of the write line like the first current switch, and the fourth current switch is provided corresponding to an opposite end of the write line like the second current switch. The third current switch and the fourth current switch become opposite operation state to each other and the second differential switch pair acts like the first differential switch pair. Accordingly, of both ends of the write line, the side controlled by the current switch which is on, of the second differential switch pair is selected as the write current outflow side.

When the current direction control section is thus configured, it is desirable that the first current switch and the fourth current switch should operate so as to become the same open/closed state, and that the second current switch and the third current switch should operate so as to become the opposite open/closed state to that of the first and fourth current switches. Accordingly, the first differential switch pair and the second differential switch pair select different sides of both ends of the write line as the inflow side and the outflow side for determining the direction in which the write current flows into the write line. The expression "the same open/closed state" in the invention is the state in which open/closed as the main operation of the switch matches so that the current direction control section, etc., functions sufficiently, and also contains the relationship of slight lag of the open/closed timing, etc., caused by the response time, etc., of the switch or the element connected to the switch.

It is desirable that at least either the first or second differential switch pair should perform open/closed operation in response to the input data signal. According to the configuration, the direction of the write current is controlled directly based on the data signal value. Further, preferably both ends of the write line are connected to a pair of joint points between the first and second differential switch pairs. In this case, the current direction control section has a specific configuration wherein one end and an opposite end of the write line are connected to the first and second differential switch pairs at a pair of joint points therebetween. The pair of joint points is, for example, the joint point between the first and third current switches and the joint point between the second and fourth current switches.

Further, preferably the current direction control section includes differential control means for controlling so that the first current switch and the fourth current switch become the same open/closed state and the second current switch and the third current switch become the opposite open/closed state to that of the first and fourth current switches. In the current direction control section, the differential control means controls the operation of the current switches for properly driving the first and second differential switch pairs.

It is desirable that the differential control means should detect the open/closed state of one of the first and second differential switch pairs and should control the open/closed operation of the other based on the detection result. At this time, the operation of the other is controlled in response to the operation state of one differential switch pair and the first and second differential switch pairs are related to each other and are driven.

Preferably, if the differential control means includes a fifth current switch and a sixth current switch for operating so as to become the opposite open/closed state to each other, the function can be demonstrated in the simplest configuration. More specifically, preferably the fifth current switch detects the open/closed state of the third current switch and causes the second current switch to operate so as to become the same open/closed state as the third current switch, and the sixth current switch detects the open/closed state of the fourth current switch and causes the first current switch to operate so as to become the same open/closed state as the fourth current switch. Two pairs of the current switches always becoming the same open/closed state exist between the first and second differential switch pairs. That is, the two pairs are the pair of (second current switch and third current switch) and the pair of (first current switch and fourth current switch). The operation of the two pairs is controlled by the fifth and sixth current switches and the two pairs become opposite open/closed state to each other.

Further, as the specific configuration of the current direction control section, preferably the first to fourth current switches of the first and second differential switch pairs are implemented as first to fourth transistors. Bipolar transistors, MOSFETs, etc., are available as the transistors and any may be adopted.

In this case, the correspondence between each switch and the write line is as follows: The write line is connected at one end to an emitter of the first transistor and a collector of the third transistor and at an opposite end to an emitter of the second transistor and a collector of the fourth transistor. Further, preferably the current direction control section is implemented as the transistors as follows: For example, collectors of the first and second transistors may be connected to a power supply. The power supply and the write line are connected through the first and second transistors and power supply current is supplied from the conduction side to the write line in response to switching of the first and second transistors. The expression "power supply" mentioned here is the supply source of current or voltage required for circuit operation and refers to the internal power supply line of the magnetic memory device. One of the third and fourth transistors of the second differential switch pair may have a base to which a write data signal is input and the other may have a base to which a signal provided by inverting the data signal is input. The expression "signal provided by inverting the data signal" mentioned here is a signal having an opposite logical value to that of the data signal. In this case, the third and fourth transistors are driven based on the data signal for selecting the current outflow end to allow current to flow in the direction corresponding to the information to be written in cooperation.

Further, if the current direction control section is implemented as the first to fourth transistors and includes the differential control means made up of the fifth and sixth current switches, preferably the fifth and sixth current switches are implemented as fifth and sixth transistors.

In addition, preferably the fifth and sixth transistors have bases connected to the collectors of the third and fourth transistors and have collectors to which bases of the second and first transistors are connected. The potential at the collector of the third transistor is input to the base of the fifth transistor and the fifth transistor operates in response to the potential. The potential at the collector of the fifth transistor is input to the base of the second transistor and the second transistor operates in response to the potential. Likewise, the potential at the collector of the fourth transistor is input to the base of the sixth transistor and the sixth transistor operates in response to the potential. The potential at the collector of the sixth transistor is input to the base of the first transistor and the first transistor operates in response to the potential.

Preferably, the fifth and sixth transistors specifically are connected as follows: First, the write current drive circuit may include a seventh transistor functioning as a switch for operating the write current drive circuit and a first current limiting resistor, and the seventh transistor may have a collector to which emitters of the fifth and sixth transistors are connected in common and may have an emitter grounded through the first current limiting resistor. A first bias resistor may be provided between the connection point of the collector of the fifth transistor and the base of the second transistor and a power supply and a second bias resistor may be provided between the connection point of the collector of the sixth transistor and the base of the first transistor and the power supply. According to the configuration, the circuit portion made up of the fifth and sixth transistors (differential control means) is configured as a differential amplification circuit having a current path independent of the first to fourth transistors (first and second differential switch pairs).

If the write current drive circuit includes the first to sixth transistors and the first and second bias resistors, it is desirable that the first and second transistors should have characteristics matched, the third and fourth transistors should have characteristics matched, the fifth and sixth transistors should have characteristics matched, and the first and second bias resistors should have characteristics matched. The expression "characteristics matched" is used to mean that the electric characteristics of the paired elements are roughly equal. If the characteristics of the paired elements are matched, the write current drive circuit performs the proper differential operation as a whole.

Preferably, in the magnetic memory device of the invention, the current amount control section of the write current drive circuit is provided on the path of the write current flowing out from the write line. Accordingly, the write current when it flows into the write line always undergoes constant current control.

The current amount control section can be embodied as follows: It includes at least an eighth transistor and a second current limiting resistor, and the eighth transistor has a collector connected to emitters of the third and fourth transistors in common, has an emitter grounded through the second current limiting resistor, and has a base to which a constant voltage is input selectively. Accordingly, the current amount control section is shared at both ends of the write line and this single circuit acts so as to determine the magnitude of the flowing-out current from the ground side if either of both ends of the write line becomes the current outflow side. The eighth transistor can be used as the transistor functioning as a switch for operating the write current drive circuit in addition to the current determination function. That is, the active signal for the write current drive circuit is input to the base of the eighth transistor at constant voltage.

In the magnetic memory device of the invention, it is desirable that the first to eighth transistors, the first and second bias resistors, and the first and second current limiting resistors making up the write current drive circuit should be integrated in the same area. As the elements are placed near to each other, temperature change during driving becomes almost equal and in the elements having electric characteristics previously made roughly equally matched, the mutual characteristic values can be prevented from varying. That is, the elements paired on the characteristics operate according to similar characteristics and further the elements of a differential pair can provide proper differential output.

The magneto-resistance effect element in the magnetic memory device of the invention includes, for example, a layered product including the magnetic sensitive layer and configured so that a current flows in a perpendicular direction to the deposition face; and a toroidal magnetic layer being disposed on one face of the layered product so that the direction along the deposition face is an axial direction and penetrated by the write line. The "external magnetic field" at this time means not only a magnetic field produced by the current flowing into the write line, but also a reflux magnetic field produced in the toroidal magnetic layer. The term "toroidal" of the "toroidal magnetic layer" indicates the state in which when viewed at least from the write line penetrating the toroidal magnetic layer, the circumstances are completely surrounded magnetically and electrically continuously and the section in the direction crossing the write line is closed. Therefore, the toroidal magnetic layer may contain an insulating substance so long as it is magnetically and electrically continuous and may include an oxide film produced in the manufacturing process. The "axial direction" points to the opening direction when attention is focused on the single toroidal magnetic layer, namely, the extension direction of the write line penetrating the toroidal magnetic layer. Further, the expression "being disposed on one face of the layered product so that the direction along the deposition face is an axial direction" contains not only the case where the toroidal magnetic layer is disposed on one face of the layered product as a separate body from the layered product, but also the case where the toroidal magnetic layer is disposed so as to contain a part of the layered product. In such a magneto-resistance effect element, a current is allowed to flow into the write line, whereby a closed magnetic path is formed in the toroidal magnetic layer. Accordingly, magnetization inversion of the magnetic sensitive layer is performed efficiently.

If the magneto-resistance effect element has the described configuration, preferably the write line includes a plurality of first write lines and a plurality of second write lines extended so as to cross the plurality of first write lines, and the first and second write lines are extended in parallel with each other in the area penetrating the toroidal magnetic layer. When currents flow in the same direction in the parallel portion of the first and second write lines, namely, the area of the toroidal magnetic layer, the magneto-resistance effect element is selected and information is written. At the time, induced magnetic field produced by the first and second write lines occurs so as to enhance in the same direction.

In the magnetic memory device, one storage cell may include a pair of the magneto-resistance effect elements. Two magneto-resistance effect elements each capable of storing one-unit information solely are used to store one-unit information.

Preferably, in the magnetic memory device, further the magnetization directions of the magnetic sensitive layers in the pair of the magneto-resistance effect elements change so as to become antiparallel with each other according to magnetic fields induced to currents flowing through the first and second write lines and information is stored in the storage cell. The expression "magnetization directions are antiparallel with each other" in the invention contains not only the case where the angle between mutual magnetization directions, namely, the directions of average magnetization in the magnetic layer is strictly 180 degrees, but also the case where the angle between mutual magnetization directions shifts by a predetermined angle from 180 degrees because of a manufacturing error, an error caused by incompletely uniaxial placement, or the like. In the magnetic memory device, magnetization of the magnetic sensitive layer in one of paired magneto-resistance effect elements and that of the other take either of the two states of facing each other and being opposite to each other, to which binary information corresponds.

According to the invention, there is provided a write current drive circuit applied to a magnetic memory device including a magneto-resistance effect element including a magnetic sensitive layer whose magnetization direction changes according to an external magnetic field and a write line to which a write current is supplied to apply an external magnetic field to the magnetic sensitive layer, the write current drive circuit including a pair of connection ends to which both ends of the write line are connected; a current direction control section for controlling the direction of the write current in the write line; and a current amount control section for controlling the amount of the write current allowed to flow into the write line to a constant value. The write current drive circuit has a similar configuration to that of the magnetic memory device of the invention.

Preferably, the current direction control section includes a first differential switch pair including a first current switch and a second current switch being provided corresponding to both ends of the write line for operating so as to become an opposite open/closed state to each other; a second differential switch pair including a third current switch and a fourth current switch being provided corresponding to the first current switch and the second current switch for operating so as to become an opposite open/closed state to each other; and differential control means for controlling so that the first current switch and the fourth current switch become the same open/closed state and the second current switch and the third current switch become the opposite open/closed state to that of the first and fourth current switches.

In the current direction control section having the described configuration, the differential control means controls each current switch of the first and second differential switch pairs so as to perform the same operation as the current switch different in the correspondence concerning both ends of the write line. Consequently, one end of the write line is selected by the current switch of the first differential switch pair and an opposite end is selected by the current switch of the second differential switch pair for determining the direction in which the current is allowed to flow to be one direction.

For example, the first to fourth current switches are implemented as first to fourth transistors. In this case, as the specific connection relationship between the write current drive circuit and the write line, the write line can be connected at one end to an emitter of the first transistor and a collector of the third transistor and at an opposite end to an emitter of the second transistor and a collector of the fourth transistor.

Further, in the write current drive circuit of the invention, the current amount control section can include a transistor having a base to which a constant voltage is input and a current limiting resistor and can be provided on the path of the write current flowing out from the write line.

According to the invention, there is provided a write current drive method applied to a magnetic memory device including a magneto-resistance effect element including a magnetic sensitive layer whose magnetization direction changes according to an external magnetic field and a write line to which a write current is supplied to apply an external magnetic field to the magnetic sensitive layer, the write current drive method including the steps of selecting one of both ends of the write line to which current is to be supplied as an inflow side of the write current and the other as an outflow side, thereby controlling the direction of the write current; and supplying the write current while controlling so that the write current flows on the write line in a constant current value. In the write current drive method of the invention, the write current is controlled in both the magnitude and the direction on the write line and is supplied to the write line.

More specifically, preferably the write current drive method includes the steps of providing a first differential switch pair including a first transistor and a second transistor being provided corresponding to both ends of the write line for operating so as to become an opposite open/closed state to each other; a second differential switch pair including a third transistor and a fourth transistor being provided corresponding to the first transistor and the second transistor for operating so as to become an opposite open/closed state to each other; and differential control means for controlling so that the first transistor and the fourth transistor become the same open/closed state and the second transistor and the third transistor become the opposite open/closed state to that of the first and fourth transistors; connecting the write line at one end to an emitter of the first transistor and a collector of the third transistor and at an opposite end to an emitter of the second transistor and a collector of the fourth transistor; bidirectionally switching the direction of the write current allowed to flow into the write line; providing a current amount control section including a transistor having a base to which a constant voltage is input and a current limiting resistor on the path of the write current flowing out from the write line; and controlling the amount of the write current in the write line to a constant value.

In the write current drive method, the first and second differential switch pairs made up of the first to fourth transistors to which both ends of the write line are connected and the differential control means for controlling the operation of the first and second differential switch pairs switch bidirectionally the direction of the write current on the write line. The current amount control section implemented as the constant current circuit on the path of the write current flowing out from the write line controls the magnitude of the write current to a constant value.

More specifically, preferably the third and fourth transistors are caused to perform open/closed operation in response to the direction in which the write current is allowed to flow into the write line, whereby the second differential switch pair selects one end of the write line as an outflow side of the write current, the differential control means detects the open/closed state of each transistor of the second differential switch pair and controls the operation of the second transistor so as to become the same open/closed state as the third transistor and the operation of the first transistor so as to become the same open/closed state as the fourth transistor, and the first and second transistors perform open/closed operation, whereby the first differential switch pair selects the other end of the write line as an inflow side of the write current. At this time, the write current flows on the write line from the one end selected as the inflow side to the opposite end selected as the outflow side.

BRIEF DESCRIPTION OF THE DRAWINGS

FIG. 29A is a drawing to show the relationship between the current drive and write line shown in FIG. 28; FIG. 29B is a schematic drawing of a current drive and write line according to a modification; and FIG. 29C is a schematic drawing of write circuitry designed for solving problems involved in the circuitry in FIGS. 29A and 29B.

DETAILED DESCRIPTION OF THE PREFERRED EMBODIMENTS

Referring now to the accompanying drawings, there is shown a preferred embodiment of the invention.

Figure 1:
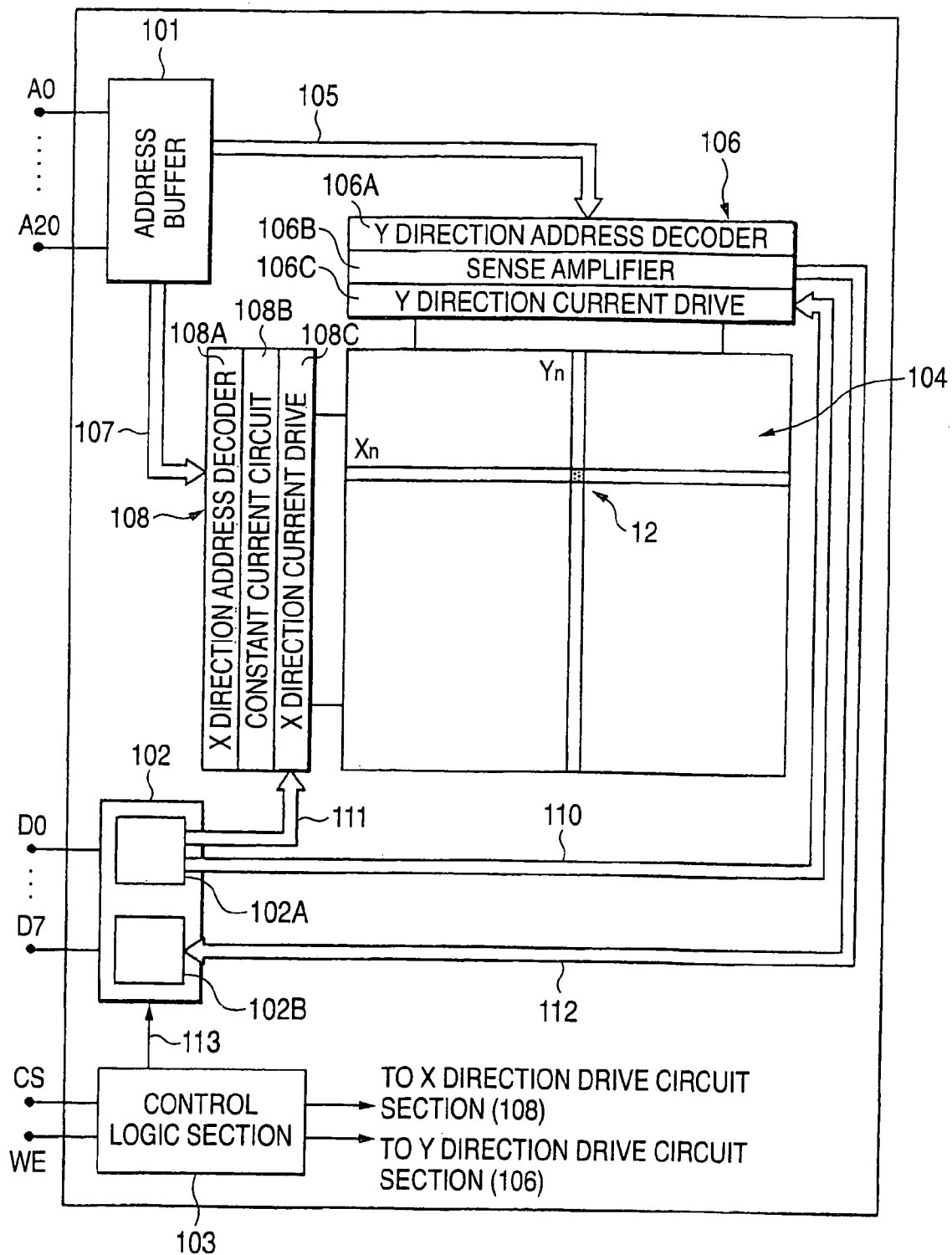
FIG. 1 is a block diagram to show the general configuration of a magnetic memory device according to one embodiment of the invention.

FIG. 1 is a block diagram to show the general configuration of a magnetic memory device according to one embodiment of the invention. The magnetic memory device is MRAM implemented as a semiconductor memory chip and includes main components of an address buffer 101, a data buffer 102, a control logic section 103, a storage cell section 104, a Y direction drive circuit section 106, and an X direction drive circuit section 108.

The storage cell section 104 includes a large number of storage cells 12 arranged in a word line direction (X direction) and a bit line direction (Y direction) so as to form a matrix as a whole. Each storage cell 12, which is the minimum unit for storing data, stores bit data of "0" or "1." Here, each row and each column of the storage cells 12 in the storage cell section 104 are called word row Xn and bit row Yn respectively.

The Y direction drive circuit section 106 is made up of Y direction address decoders 106A, sense amplifiers 106B for read, and Y direction current drives 106C for write, each being connected to the storage cell section 104 for each bit row Yn (Y1, Y2, ...) of the storage cells 12.

The X direction drive circuit section 108 is made up of X direction address decoders 108A, constant current circuits 108B for read, and X direction current drives 108C for write, each being connected to the storage cell section 104 for each word row Xn (X1, X2, ...) of the storage cells 12. Therefore, for example, one storage cell 12 is uniquely selected according to the address (Xn, Yn) in the word direction and the bit direction input from the X direction address decoder 108A and the Y direction address decoder 106A, as shown in the figure.

The address buffer 101 includes external address input pins A0 to A20 and is connected to the Y direction address decoder 106A and the X direction address decoder 108A via address lines 105 and 107. The address buffer 101 has a function of inputting a selection signal to select one storage cell 12 from the external address input pins A0 to A20 and amplifying the selection signal to a voltage level required in the address recorders 106A and 108A by an internal buffer amplifier. The address buffer 101 separates the amplified selection signal into two selection signals in the word row direction (X direction) and the bit row direction (Y direction) of the storage cell 12 and inputs the selection signals to the address decoders 106A and 108A. If the magnetic memory device has two or more storage cell sections 104, an address signal to select one storage cell section 104 from among the storage cell sections 104 is also input to the address buffer 101.

The data buffer 102 includes external data pins D0 to D7 to transfer a digital data signal to and from an external system and is connected to a control logic section 103 by a control signal line 113. The data buffer 102 is made up of an input buffer 102A and an output buffer 102B, which are operated by a control signal from the control logic section 103. The input buffer 102A is connected to the Y direction current drive 106C and the X direction current drive 108C via write data buses 110 and 111 and has a function of inputting a data signal from the external data pins D0 to D7 at the memory write time, amplifying the data signal to a necessary voltage level by an internal buffer amplifier, and outputting the amplified data signal to the current drives 106C and 108C. The output buffer 102B is connected to the sense amplifier 106B via a read data bus 112 and has a function of outputting a read data signal input from the sense amplifier 106B to the external data pins D0 to D7 at a low impedance by using an internal buffer amplifier at the memory read time.

The control logic section 103 includes an input pin CS and an input pin WE and is connected to the data buffer 102 by the control signal line 113. The control logic section 103 performs operation control for the storage cell section 104, and a signal for indicating whether or not the write/read operation of the magnetic memory device is activated (chip select (CS)) is input from the input pin CS. A write enable signal (WE) for switching the operation between write and read is input from the input pin WE. The control logic section 103 has a function of amplifying a signal voltage input from the input pin CS, WE to a voltage level required in the drive circuit section 106, 108 by an internal buffer amplifier and sends the amplified signal to the drive circuit section 106, 108.

Figure 2:
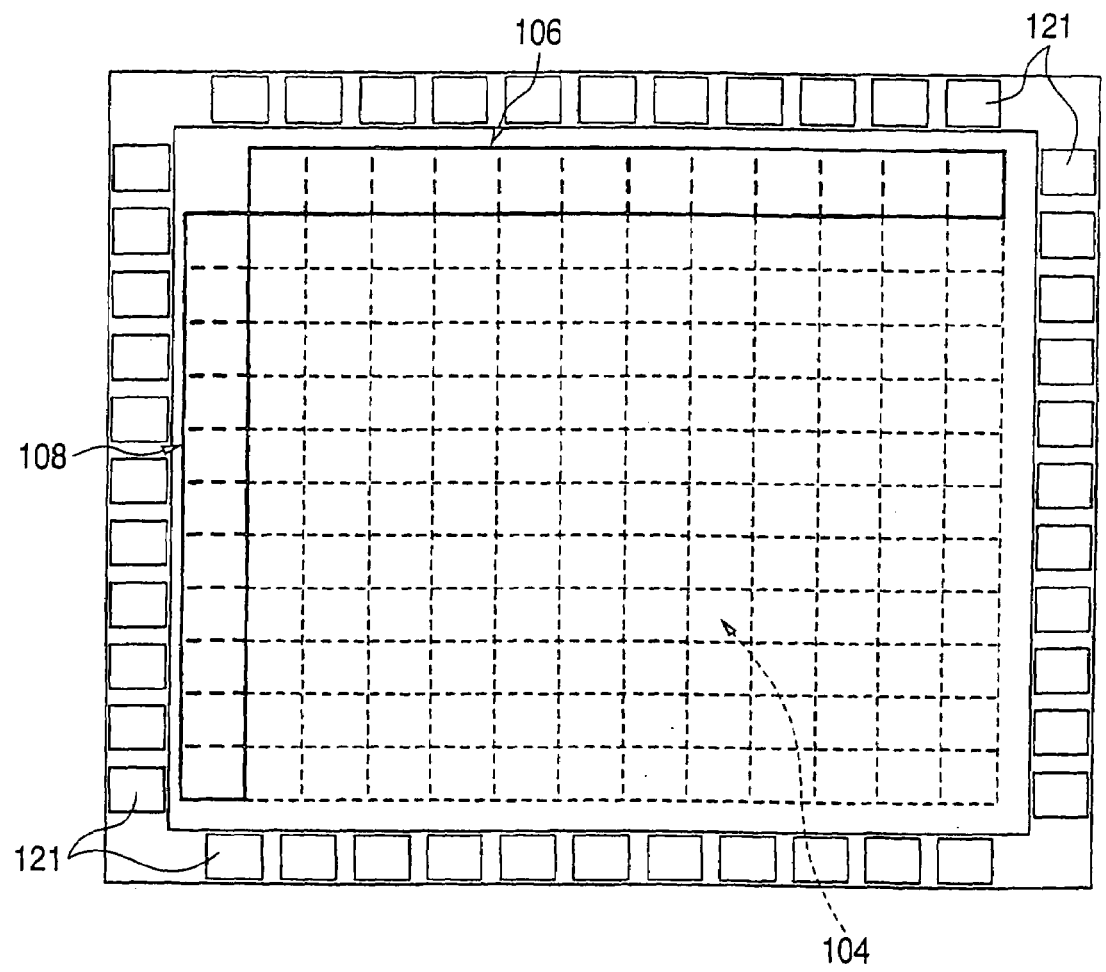
FIG. 2 is a plan view to represent the configuration of the main components of the magnetic memory device shown in FIG. 1.

The specific layout of the main components of the magnetic memory device is, for example, as shown in FIG. 2. The outermost frame in the figure indicates a die cut line. The storage cell section 104 is disposed in a wide area at the center of the silicon chip, and the circuits for driving the storage cell section 104, such as the drive circuit sections 106 and 108, are installed in small areas surrounding the storage cell section 104. The circuits are connected to the whole control section of the device or an external system through bonding pads 121. Here, the X direction drive circuit section 108 is disposed on the left side of the storage cell section 104 and the Y direction drive circuit section 106 is disposed on the top side of the storage cell section 104.

[Configuration of Write Circuit]

Figure 3:
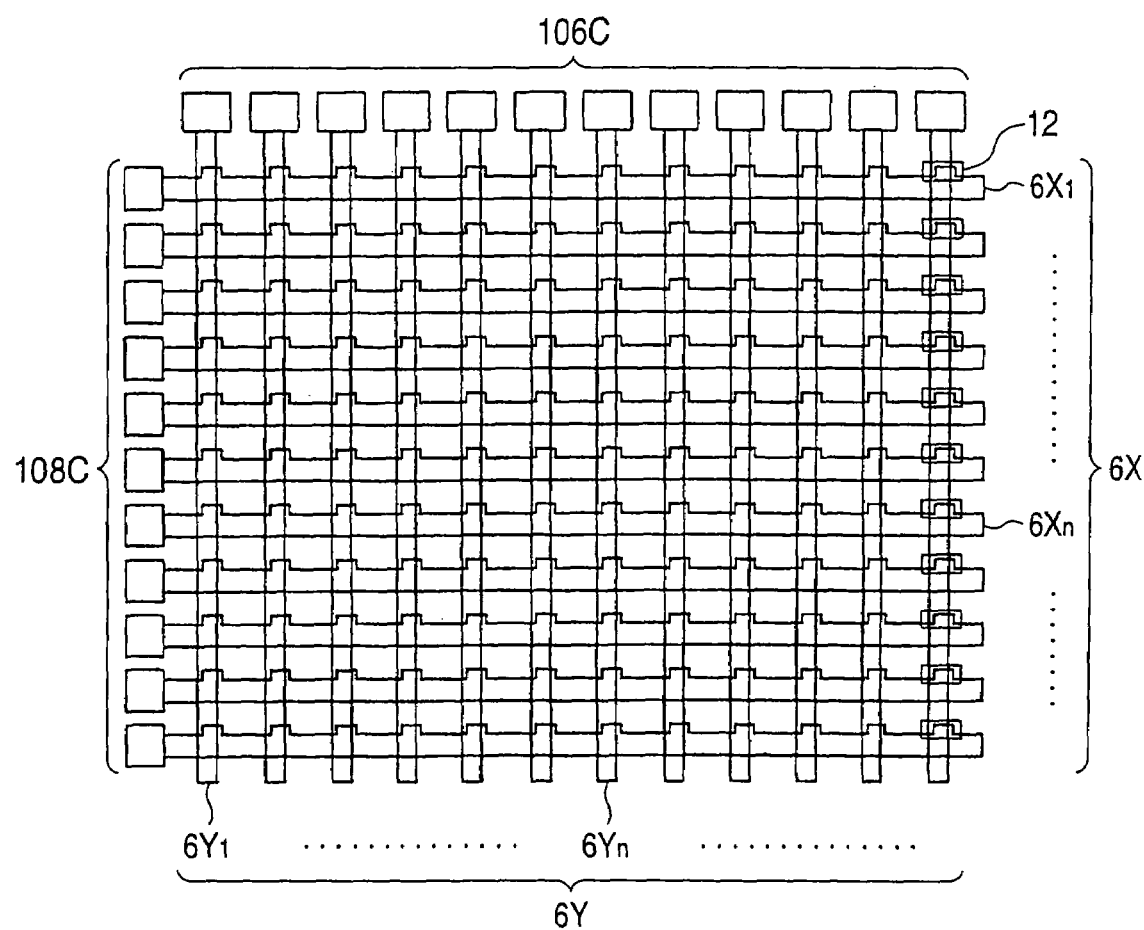
FIG. 3 is a diagram to show the configuration of write circuitry of the magnetic memory device shown in FIG. 1.

FIG. 3 represents the positional relationship of the current drives and the storage cells with write lines. Each of the storage cells 12 receives current supply from both the X direction current drive 108C and the Y direction current drive 106C over each of a plurality of write bit lines 6Y (6Y1, ..., 6Yn, ...) extending in the Y direction and each of a plurality of write word lines 6X (6X1, ..., 6Xn, ...) extending in the X direction so as to cross the write bit lines 6Y, and information is written into the storage cell 12.

The write word line 6X and the write bit line 6Y are disposed so as to each draw a closed loop shaped. The write word line 6X has a portion which is bent and becomes parallel with the write bit line 6Y each time either of go and return passages crosses the write bit line 6Y. Here, a magneto-resistance effect element is disposed for each formation area of the parallel portion, and one storage cell 12 is made up of a pair of magneto-resistance effect elements 12A and 12B disposed in a pair of parallel portions formed by one write word line 6X and one write bit line 6Y (see FIG. 6). In the description that follows, the write word line 6X, write bit line 6Y will be simply called the write line 6X, 6Y and when they are collectively called regardless of the X or Y direction, the write line 6.

The X direction current drive 108C, the Y direction current drive 106C is a constant current source circuit for supplying a current of a predetermined value to the write word line 6X, the write bit line 6Y when information is written into the storage cell 12. Here, both ends of one write word line 6X are connected to one of the X direction current drives 108C, and both ends of one write bit line 6Y are connected to one of the Y direction current drives 106C. That is, the write word lines 6X (6X1, ..., 6Xn, ...) and the X direction current drives 108C are arranged in a one-to-one correspondence with the word rows Xn of the storage cells 12. Likewise, the write bit lines 6Y (6Y1, ..., 6Yn, ...) and the Y direction current drives 106C are arranged in a one-to-one correspondence with the bit rows Yn of the storage cells 12.

[Configuration of Current Drive]

Figure 4:
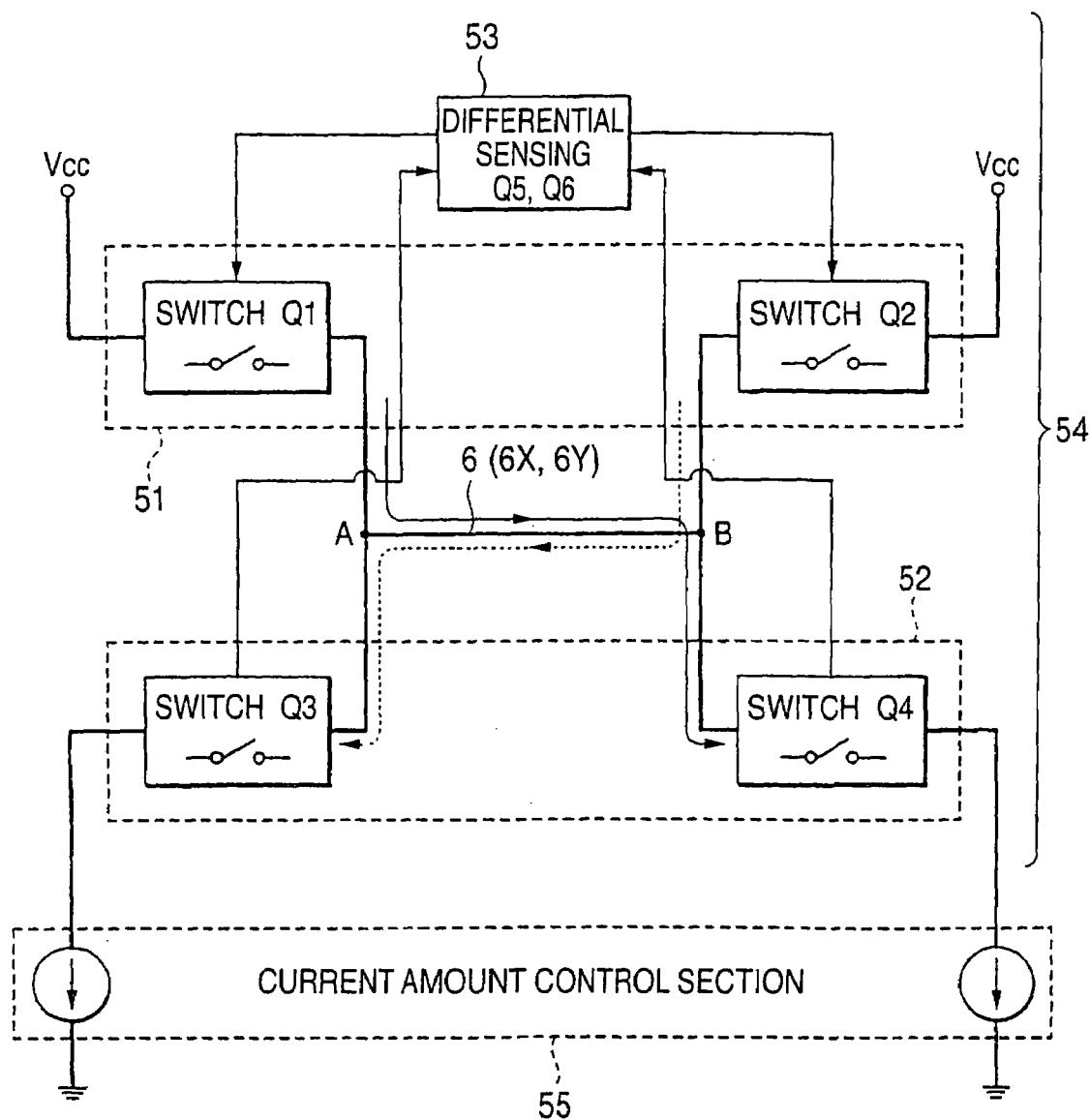
FIG. 4 is a conceptual block diagram to describe the functions of a current drive shown in FIG. 1.

Each of the current drives 108C and 106C has (1) a switch function of controlling the direction of a current allowed to flow into the write line 6X, 6Y and (2) a function of fixing the current amount to a constant value. FIG. 4 is a conceptual block diagram of the current drive of the embodiment focusing attention on (1) the switch function of controlling the current direction of the write line and (2) the constant current control function in the write line.

The current direction control function is accomplished by a current direction control section 54 made up of first and second differential switch pairs 51 and 52 and differential control means 53 (see FIG. 4). The first differential switch pair 51 is made up of switches Q1 and Q2, each of which is placed between power supply Vcc and end A, B of the write line 6. As one is turned on and the other is turned off, the power supply Vcc is connected only to either the end A or B, allowing a current to flow in. The second differential switch pair 52 is made up of switches Q3 and Q4, each of which is placed between the end A, B of the write line 6 and ground. As one is turned on and the other is turned off, only either the end A or B is led to ground, allowing a current to flow out.

Therefore, while the switches Q1 and Q4 are closed and the switches Q2 and Q3 are open, a current in the solid line direction flows into the write line 6. While the switches Q1 and Q4 are open and the switches Q2 and Q3 are closed, a current in the dotted line direction flows into the write line 6. That is, in this case, to perform bidirectional control of the current in the write line 6, the switches Q1 and Q4 need to take the same operation state and the switches Q2 and Q3 need to take the operation state opposite thereto. Thus, the first and second differential switch pairs 51 and 52 perform switching operation complementary to each other, making possible the current direction control.

Here, the differential control means 53 performs the operation control of the first and second differential switch pairs 51 and 52. The differential control means 53 causes the two differential switch pairs 51 and 52 to cooperate by a method of differentially sensing the operation state of one of the first and second differential switch pairs 51 and 52 and controlling the operation of the other based on the sensing result (for example, controlling the switch Q1, Q2 on/off in response to the on/off state of the switch Q3, Q4).

The simplest configuration of the differential control means 53 is provided when the differential control means 53 is made up of a pair of switching elements. Here, to describe the basic operation, the differential control means 53 is made up of switches Q5 and Q6, called third differential switch pair. Specifically, the switches Q5 and Q6 differentially sense the switches Q3 and Q4 and control the switches Q1 and Q2 so that the switch Q2 becomes the same on or off state as the switch Q3 and the switch Q1 becomes the same on or off state as the switch Q4 based on the sensing result.

Figure 5:
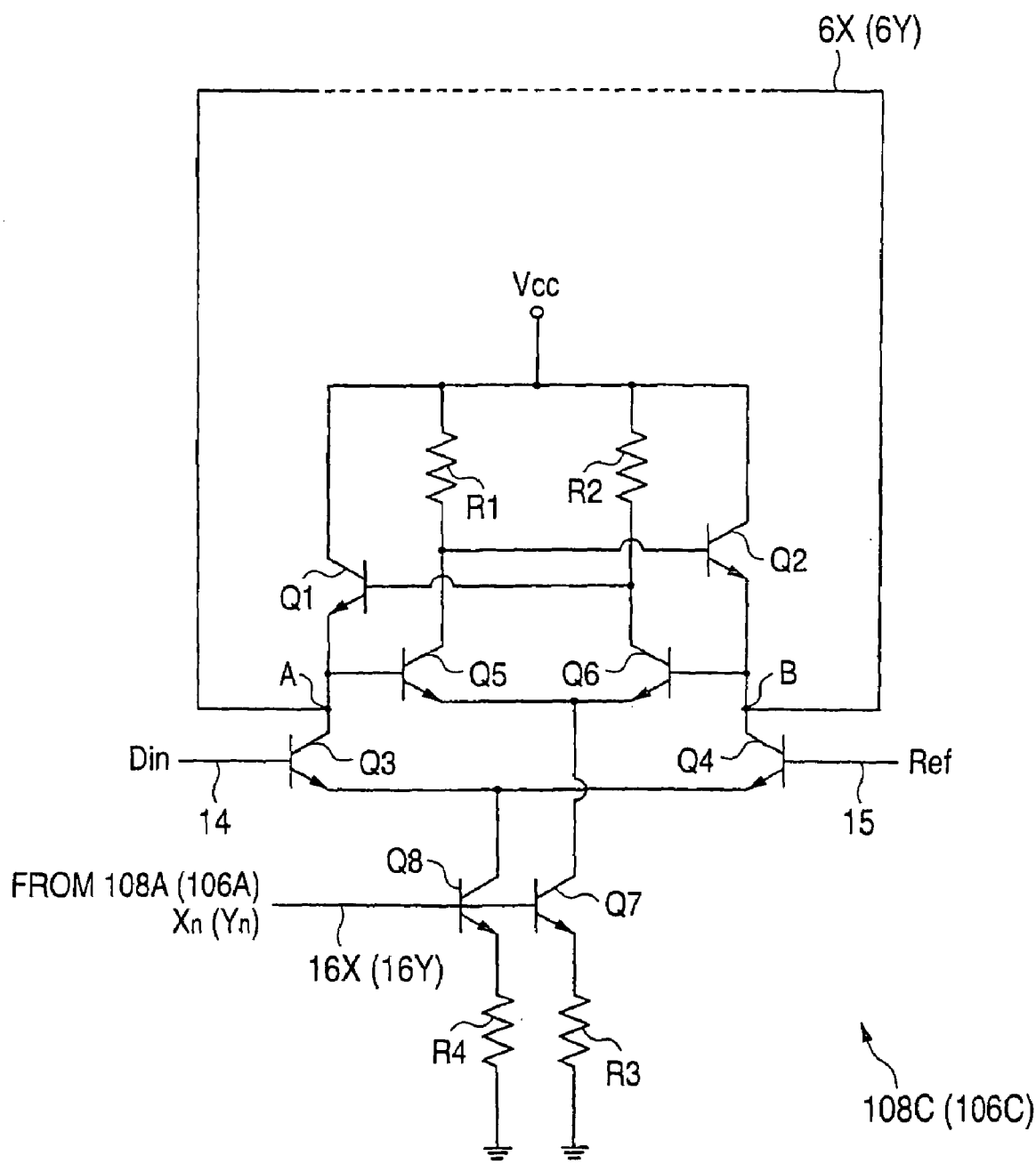
FIG. 5 is a circuit diagram of the current drive shown in FIG. 1.

Next, the functional configuration of the current drive of the embodiment will be discussed with reference to FIG. 5 as compared with FIG. 4. FIG. 5 shows the specific configuration of the current drive in the embodiment. Each of the X direction current drive 108C and the Y direction current drive 106C is configured as shown in the figure and transistors Q1 to Q6 correspond to the switches Q1 to Q6 in FIG. 4. Both ends of the write word line 6X are connected between drive points A and B of the X direction current drive 108C, and both ends of the write bit line 6Y are connected between drive points A and B of the Y direction current drive 106C.

The operation of each of the differential switch pairs 51 to 53 previously described is performed complementarily in the channel of the transistors Q3, Q5, and Q2 and the channel of the transistors Q4, Q6, and Q1 on the specific circuit. One of the pair of (transistors Q3 and Q2) and the pair of (transistors Q4 and Q1) takes the on state and the other takes the off state by differential sensing of the transistors Q5 and Q6. Further, the transistor Q3 has a base to which a data signal line 14 (Din) is connected and the transistor Q4 has a base to which a reference signal line 15 (Ref) is connected and the transistors are switched based on write data. That is, the transistors Q5 and Q6 differentially sense the on/off state of the transistors Q3 and Q4 operating with data signal input as a trigger, and perform operation control of the transistors Q1 and Q2 so that the transistor Q1 becomes the same operation state as the transistor Q4 and the transistor Q2 becomes the same operation state as the transistor Q3.

On the other hand, the constant current control in the write line, of the current drive in the embodiment is performed by a current amount control section 55 placed on the ground side of the write line 6 (see FIG. 4). The current amount control section 55 is placed on the ground side further from the write line and fixes the amount of current flowing out from the write line 6. That is, it is the current amount in the write line 6 and therefore a current of a constant amount always flows in the write line 6 independently of the resistance value thereof. In FIG. 4, the current amount control section 55 is represented as a constant current circuit placed between the switches Q3 and Q4 and ground. This is representation like an equivalent circuit to describe the function; in the actual circuit configuration, the current amount control section 55 maybe one constant current circuit commonly wired to the transistors Q3 and Q4, as shown in FIG. 5.

In FIG. 5, the constant current circuit corresponding to the current amount control section 55 is implemented as a transistor Q8, a resistor R4, and decode signal voltage input to a word decode line 16X (bit decode line 16Y). That is, in the embodiment, a decode signal input to the word decode line 16X (bit decode line 16Y) is designed to become a constant voltage, for example, 1.5 V at the stage preceding the current drive 108C (106C), so that the current amount flowing through the transistor Q8 and the resistor R4 becomes constant. Thus, the constant voltage action borne by a band gap reference element and a current mirror circuit in a usual constant current circuit can also be transferred to another component circuit and the circuit configured in one area is simplified accordingly. In the embodiment, a transistor Q7 and a resistor R3 also take the configuration of constant current circuit and the total current of the transistors Q5 and Q6 is determined. The resistors R3 and R4 correspond to "first current limiting resistor" and "second current limiting resistor" of the invention.

Figure 29A:
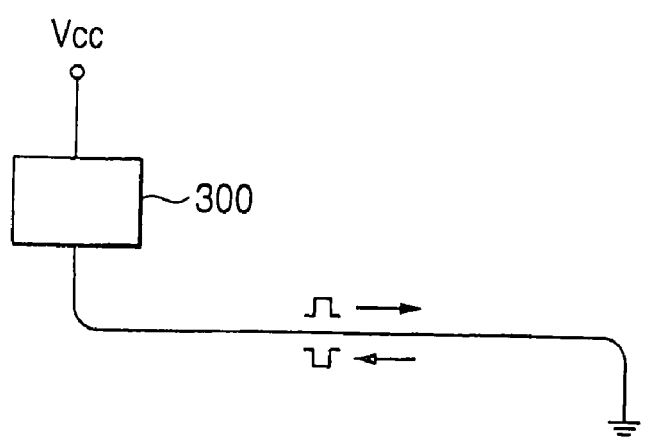
FIGS. 29A to 29C are drawings to describe problems involved in current control in the related art.
Figure 29B:
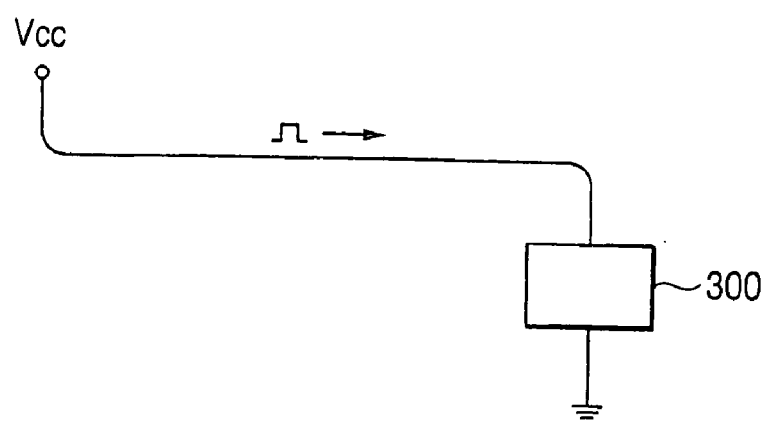
Figure 29C:
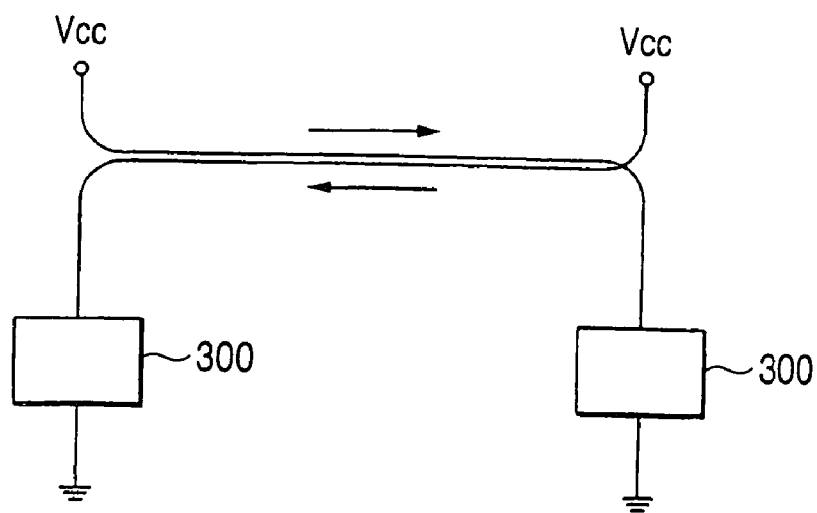

Thus, according to the configuration shown in FIG. 4, 5, the current drive 108C (106C) can be provided with both (1) the direction control function and (2) the constant current control function for the write current for excluding the effect of resistance variations in the write lines and stably supplying a constant current to the write line. In the current drive in the related art, the current amount control must be performed at the preceding stage of supplying current to the write line as described above, and such complete control cannot be performed. The configuration of the current drive of the embodiment can be assumed to be equivalent to the dual circuitry shown as the modification in the related art (FIG. 29C). It can be said that the symmetrical function configuration is realized by one circuit made up of symmetrical differential switch pair about one write line.

The element layout and connection relationship of the current drive shown in FIG. 5 will be discussed.

Between collectors of the transistors Q3 and Q4 and the power supply Vcc, from the power supply Vcc side, the collector-emitter of the transistor Q1 and the collector-emitter of the transistor Q2 functioning as a following-stage amplifying differential pair and the bases of the transistors Q5 and Q6 are connected, and further drive points A and B into which both ends of the write word line 6X (or the write bit line 6Y) are drawn are provided. The base of the transistor Q1 is connected to the collector of the transistor Q6 and the base of the transistor Q2 is connected to the collector of the transistor Q5 in a crossed fashion.

Both the emitters of the transistors Q3 and Q4 are grounded via the collector-emitter of the transistor Q8 and the resistor R4 connected in series. The transistor Q8 functions as a decoding semiconductor switch and the resistor R4 has a current limiting function.

The data signal line 14 (Din) to which a data signal based on write data is input is connected to the base of the transistor Q3. On the other hand, the reference signal line 15 (Ref) to which a reference signal provided by inverting the data signal is input is connected to the base of the transistor Q4. Here, the currents flowing into the signal lines 14 and 15 as each signal is input flow into the base-emitter of the transistor Q3 and the base-emitter of the transistor Q4, and the circuit portion made up of the transistors Q3, Q4, and Q8 operates as a differential amplifier. Further, to cause the transistor pairs including the transistors Q3 and Q4 to perform the differential operation appropriately, one of the voltage amplitudes of the data signal and the reference signal is made higher than the emitter potential common to the transistors Q3 and Q4 by $\phi$ (V) and the other is set to the same potential as the emitter potential or less or a value exceeding the emitter potential within the range of less than 0.2 V at the most.

The collectors of the transistors Q5 and Q6 are connected to the power supply Vcc via resistors R1 an R2 functioning as bias resistors (first and second bias resistors). The emitters of the transistors Q5 and Q6 are connected to the emitter-collector of the transistor Q7 and the resistor R3 in series and further to ground. The transistor Q7 also functions as a decoding semiconductor switch and the resistor R3 has a current limiting function.

Further, the address decode value of the storage cell 12 into which information is to be written is input to the bases of the transistors Q7 and Q8. That is, in each of the X direction current drives 108C, word decode line 16X (16X1, ... , 16Xn, ... ) is connected to the bases of the transistors Q7 and Q8. The decode value to select the word row Xn of the storage cell 12 is input from the X direction address decoder 108A to the word decode line 16X. In each of the Y direction current drives 106C, bit decode line 16Y (16Y1, ... , 16Yn, ... ) is connected to the bases of the transistors Q8 and Q7. The decode value to select the bit row Yn of the storage cell 12 is input from the Y direction address decoder 106A to the bit decode line 16Y.

[Configuration of Storage Cell]

Figure 6:
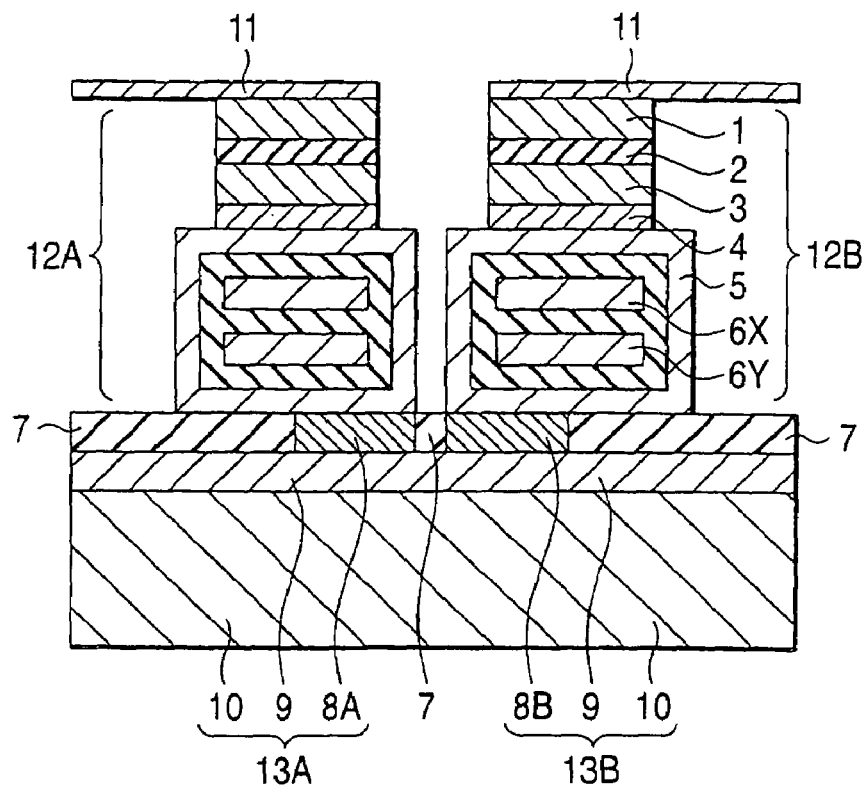
FIG. 6 is a sectional view to show the specific configuration of a storage cell shown in FIG. 1.

FIG. 6 is a sectional view to show the configuration of the storage cell according to the embodiment of the invention. Each of the magneto-resistance effect elements 12A and 12B of each storage cell 12 is a magneto-resistance effect element using GMR or TMR. Here, as a specific example, the case where the magneto-resistance effect elements 12A and 12B are TMR elements will be discussed.

The storage cell 12 has a pair of left and right magneto-resistance effect elements 12A and 12B mounted on a substrate 10. Each of the magneto-resistance effect elements 12A and 12B includes a layered product including a first magnetic layer 1, a nonmagnetic layer 2, and a second magnetic layer 3 deposited in order and a toroidal magnetic layer 5 disposed on one face of the layered product so that the direction along the deposition face is the axial direction and penetrated by the write lines 6X and 6Y (first and second write lines). The second magnetic layer 3 and the toroidal magnetic layer 5 are joined with a nonmagnetic conductive layer 4 between and are electrically connected. Also, a read sensing conductor 11 is provided on the top of the layered product (face opposite to the toroidal magnetic layer 5) of each of the magneto-resistance effect elements 12A and 12B, enabling a current in a perpendicular direction to the deposition face to flow into the layered product toward the substrate 10.

The first magnetic layer 1 is a ferromagnetic layer whose magnetization direction is fixed and the second magnetic layer 3 is a ferromagnetic layer whose magnetization direction changes according to an external magnetic field (magnetic sensitive layer). The first and second layers 1 and 3 are deposited with the very thin nonmagnetic layer 2 having a thickness of several nm (several 10 Å) between. In the layered product, if a voltage in the perpendicular direction to the deposition face is applied to between the first magnetic layer 1 and the second magnetic layer 3, for example, electrons of the second magnetic layer 3 penetrate the nonmagnetic layer 2 and move to the first magnetic layer 1 and a tunnel current flows. That is, the nonmagnetic layer 2 is a tunnel barrier layer. The tunnel current changes according to the relative angle between the spin of the first magnetic layer 1 and the spin of the second magnetic layer 3 in the interface portion with the nonmagnetic layer 2. When the spin of the first magnetic layer 1 and the spin of the second magnetic layer 3 are parallel with each other, the resistance value of the magneto-resistance effect element 12A (12B) becomes the minimum; when antiparallel, the maximum.

Magnetization of the second magnetic layer 3 is changed by an induced magnetic field caused by currents flowing the write word line 6X and the write bit line 6Y. Here, magnetization of the second magnetic layer 3 is inverted by the induced magnetic field, whereby the relative angle with magnetization of the first magnetic layer 1 is inverted. The storage cell 12 into which information is to be written is selected by a matrix drive method. Thus, the magnetic characteristics, the dimensions, and the like of the second magnetic layer 3 are set so that magnetization can be inverted only when a current flows into both the write word line 6X and the write bit line 6Y in the same direction. The description of the basic structure of the magneto-resistance effect element 12A (12B) is now complete.

Figure 7:
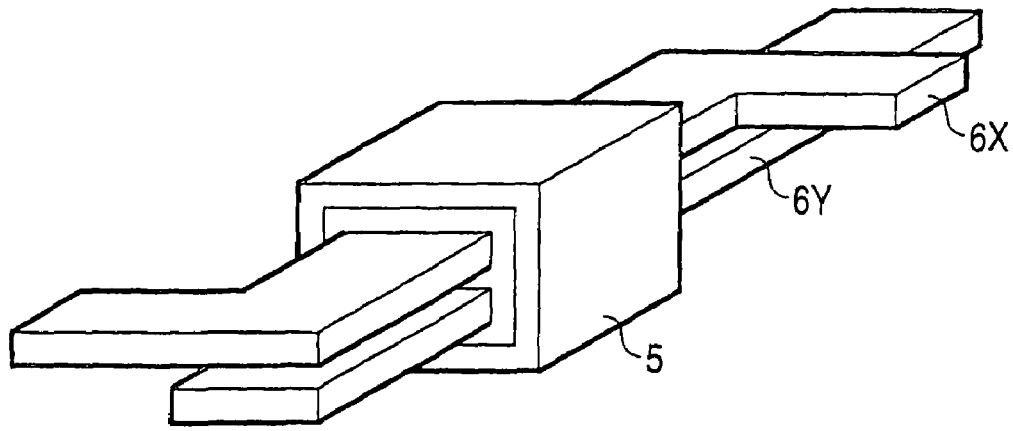
FIG. 7 is a drawing of the configuration of the main part to show how write lines penetrate the storage cell shown in FIG. 6.

The toroidal magnetic layer 5 has a tubular shape having an axis in a perpendicular direction to the plane of the drawing (FIG. 6) and contains portions of the write word line 6X and the write bit line 6Y with each other. FIG. 7 represents the write line wiring structure in the area in which the magneto-resistance effect element is disposed. In the cross area of the write lines 6X and 6Y, the write word line 6X is bent and is parallel with the writ bit line 6Y up and down and the parallel portions are contained in the toroidal magnetic layer 5. That is, the axial direction of the toroidal magnetic layer 5 is the extension direction of the write word line 6X and the writ bit line 6Y and the toroidal magnetic layer 5 is shaped like a ring closed in the sectional direction crossing the axial direction.

Figure 8:
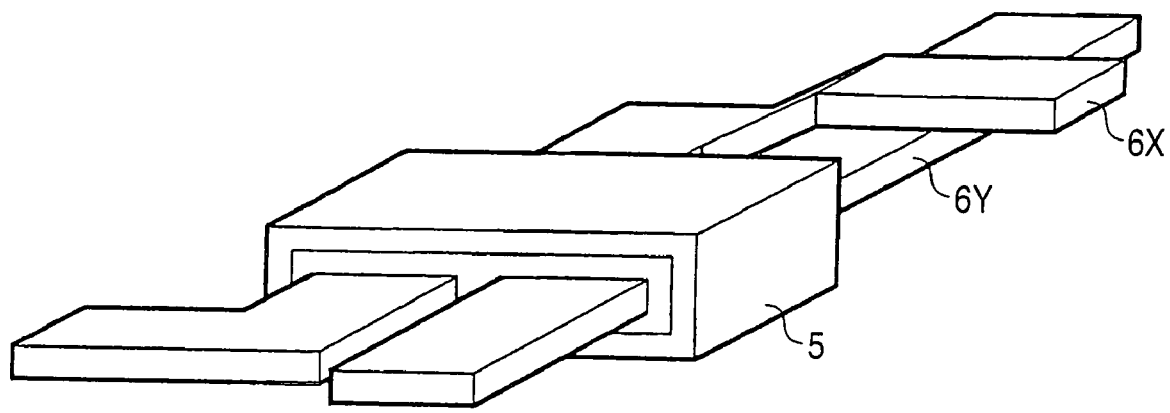
FIG. 8 is a drawing of the configuration of the main part according to a modification of the storage cell shown in FIG. 6.

Here, the resultant magnetic field of the write word line 6X and the writ bit line 6Y which are parallel is used to invert magnetization of the second magnetic layer 3; the magnitude of the induced magnetic field is larger than that of the resultant magnetic field produced when the write lines are crossed. Thus, the write operation can be performed efficiently. To make the write lines 6X and 6Y parallel with each other in the cross area thereof, they may be made parallel from side to side, for example, as shown in FIG. 8.

The toroidal magnetic layer 5 is formed of a magnetic material of high magnetic permeability and has a function of efficiently changing the magnetization direction of the second magnetic layer 3 by trapping a magnetic flux produced by current of the contained write line 6X, 6Y in the layer. The toroidal magnetic layer 5 draws a closed loop in cross section as shown in the figure, and the produced induced magnetic field circulates in the layer along the face parallel with the section. Accordingly, the toroidal magnetic layer 5 has the electromagnetic shielding effect for preventing leakage flux to the outside. Here, the toroidal magnetic layer 5 is in contact with the second magnetic layer 3 on one face, so that a magnetic field is easily transmitted to the second magnetic layer 3 and the magnetization direction of the second magnetic layer 3 near to the toroidal magnetic layer 5 at a high magnetic flux density can be changed still more efficiently.

In each of the magneto-resistance effect elements 12A (12B), a read current flows into the layered product from the read sensing conductor 11 and passes through the toroidal magnetic layer 5 to the substrate 10. Therefore, the layers of the layered product except the nonmagnetic layer 2 for allowing a tunnel current to flow, the nonmagnetic conductive layer 4, and the toroidal magnetic layer 5 use a material having conductivity. For example, a cobalt-iron alloy (CoFe) is used for the first magnetic layer 1 and the second magnetic layer 3; in addition, cobalt (Co), a cobalt-platinum alloy (Co—Pt), a nickel-iron-cobalt alloy (NiFeCo), etc., can be used. Since the first magnetic layer 1 and the second magnetic layer 3 are stabilized in a state in which the magnetization directions become parallel or antiparallel, it is desirable that the mutual easy axes of magnetization should made parallel.

The thickness of the nonmagnetic layer 2 is determined based on tunnel resistance, etc. Generally, in a magnetic memory element using a TMR element, appropriate tunnel resistance is about 10 k$\Omega \cdot (\mu m)^2$ to match with a semiconductor device of a transistor, etc. However, to provide a high density in a magnetic memory device and speed up the operation thereof, preferably the tunnel resistance is 10 k$\Omega \cdot (\mu m)^2$ or less, more preferably 1 k$\Omega \cdot (\mu m)^2$ or less. However, to realize such a tunnel resistance value, preferably the thickness of the nonmagnetic layer (tunnel barrier layer) 2 is 2 nm or less, more preferably 1.5 nm or less. However, if the nonmagnetic layer 2 is made too thin, although the tunnel resistance can be decreased, a leak current is caused to occur by asperities on the joint interface between the first magnetic layer 1 and the second magnetic layer 3 and it is feared that the MR ratio may lower. To prevent this, the nonmagnetic layer 2 needs to have a thickness to such an extent that no leak current flows; specifically it is desirable that the nonmagnetic layer 2 should have a thickness of 0.3 nm or more.

The nonmagnetic conductive layer 4 functions so as to antiferromagnetically join the second magnetic layer 3 and the toroidal magnetic layer 5; for example, ruthenium (Ru), copper (Cu), etc., is used for the nonmagnetic conductive layer 4. Iron (Fe), a nickel-iron alloy (NiFe), Co, CoFe, NiFeCo, etc., can be used for the toroidal magnetic layer 5. To concentrate the magnetic field produced by the write line 6X, 6Y on the toroidal magnetic layer 5, preferably the magnetic permeability of the toroidal magnetic layer 5 is large as much as possible; specifically 2000 or more, more preferably 6000 or more.

The write line 6 is formed of aluminum (Al), copper (Co), or an alloy thereof and the write lines 6 are electrically insulated from each other by an insulating film. The write line 6 may be made up of tungsten (W) and at least one of the materials mentioned above; in addition, it may have a structure wherein titanium (Ti), titanium nitride (TiN), and aluminum (Al) are deposited in order.

Although described in detail later in the operation description, information is stored in the storage cell 12 with one of the magneto-resistance effect elements 12A and 12B at low resistance and the other at high resistance to differentially amplify outputs from the two magneto-resistance effect elements 12A and 12B for read. Therefore, the paired magneto-resistance effect elements 12A and 12B need to be manufactured so as to become equal in resistance value, magnetic resistance change rate, and magnitude of inversion magnetic field of second magnetic layer 3.

An epitaxial layer 9 is formed on the substrate 10 where the magneto-resistance effect elements 12A and 12B are formed, and a conductive layer 8 and an insulating layer 7 are formed on the epitaxial layer 9. The conductive layer 8 is made up of conductive layers 8A and 8B insulated from each other through the insulating layer 7. The magneto-resistance effect elements 12A and 12B are formed on the tops of the conductive layer 8 and the insulating layer 7 and are positioned so that at least a part of the formation area of the magneto-resistance effect element 12A, 12B overlaps the formation area of the conductive layer 8A, 8B. Therefore, the magneto-resistance effect elements 12A and 12B are joined separately to the conductive layers 8A and 8B separated and insulated from each other and are electrically insulated from each other. That is, here the storage cell is wired so that the magneto-resistance effect elements 12A and 12B are electrically noncontinuous.

Here, the substrate 10 is an n-type silicon wafer. Generally, the n-type silicon wafer is doped with impurities of P (phosphorus) and an $n^{++}$-type substrate doped with P (phosphorus) at a high concentration is used as the substrate 10. In contrast, the epitaxial layer 9 is doped with P (phosphorus) at a low concentration to form $n^-$-type epitaxial layer. The conductive layer 8 uses metal. At this time, if the epitaxial layer 9 of the $n^-$-type semiconductor and the metal conductive layer 8 are brought into contact with each other, a band gap occurs and a Schottky diode is formed. That is, blocking diodes 13A and 13B in the read circuit of the embodiment are provided.

The blocking diode 13A, 13B is provided for preventing a read current from back flowing and passing through the magneto-resistance effect element 12A, 12B from the substrate 10 side. The magneto-resistance effect element 12A and the blocking diode 13A and the magneto-resistance effect element 12B and the blocking diode 13B are insulated from each other.

[Configuration of Read Circuit]

Figure 9:
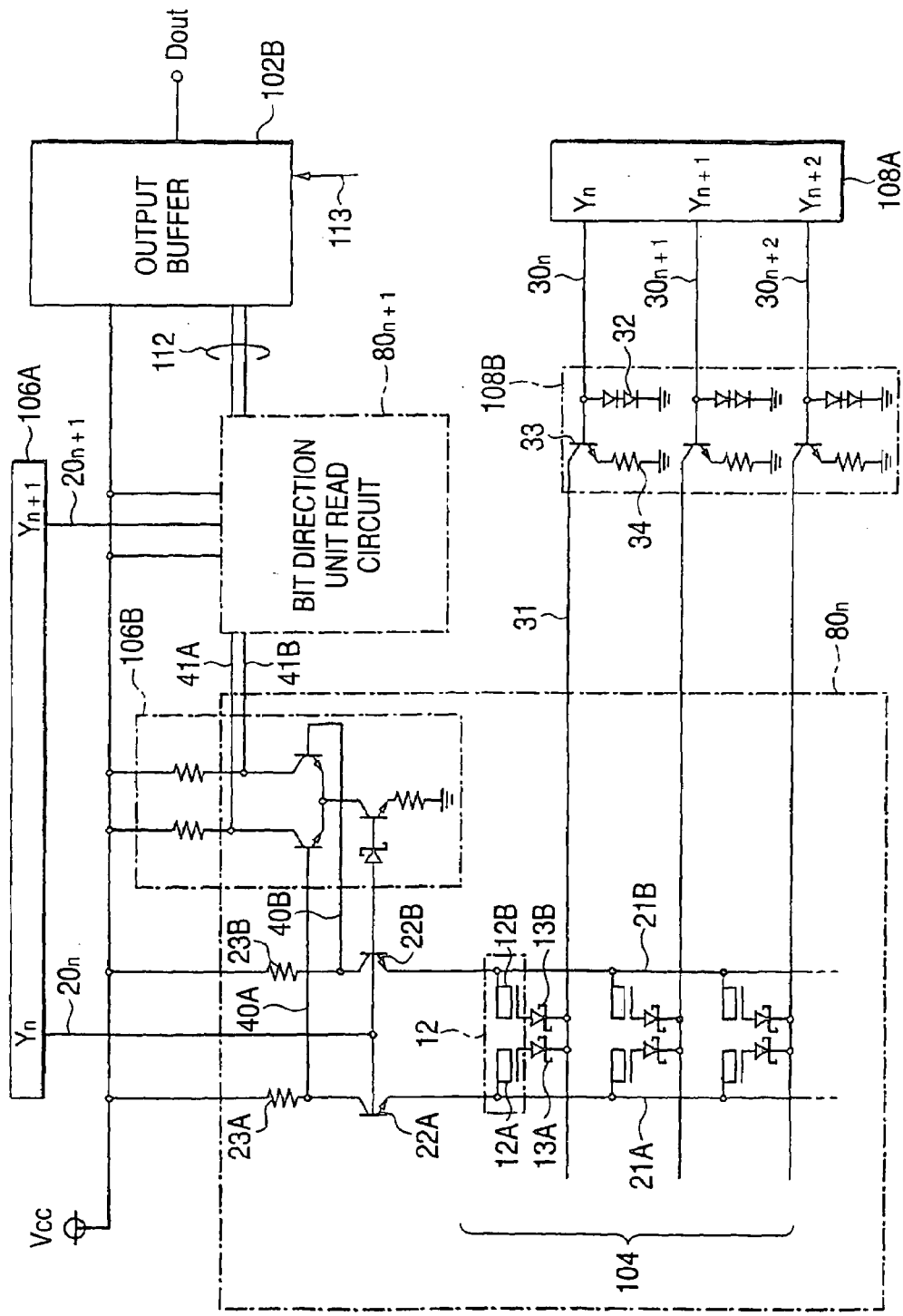
FIG. 9 is a diagram to show the configuration of read circuitry of the magnetic memory device shown in FIG. 1.

FIG. 9 is a diagram to show the configuration of circuitry made up of the storage cell section and its read circuit. The read circuitry is of differential amplification type wherein each storage cell 12 includes a pair of the magneto-resistance effect elements 12A and 12B. Here, to read information from each storage cell 12, the difference value between sensing current allowed to flow into the magneto-resistance effect element 12A and that into 12B is output (the sensing current is current flowing into the magneto-resistance effect element 12A, 12B from a sense bit decode line 21A, 21B and flowing out to a common sense word decode line 31).

In FIG. 9, the storage cells 12 for each bit row Yn of the storage cell unit 104 and a part of the read circuit containing the sense amplifier 106B make up each bit direction unit read circuit 80 ( . . . , 80n, 80n+1, . . . ) of a repetitive unit of the read circuit, and the bit direction unit read circuits 80 are arranged in parallel in the bit row direction. In each of the bit direction unit read circuits 80, the sense bit decode lines 21A and 21B are connected to the Y direction address decoder 106A via a bit decode line 20 ( . . . , 20n, 20n+1, . . . ), and the sense amplifier 106B is connected to the output buffer 102B via the read data bus 112. Since the space in the figure is insufficient to draw the whole of the bit-direction unit read circuits 80, the bit direction unit read circuits 80 corresponding to two rows are only drawn. This also applies to the storage cell unit 104 and the storage cells 12 corresponding to two rows of bit rows Yn and Yn+1 are only drawn.

The storage cell unit 104 is wired like a matrix with the sense word decode lines 31 (simply, sense word lines) arranged in the X direction and pairs of sense bit decode lines 21A and 21B (simply, sense bit lines) arranged in the Y direction. Each storage cell 12 is disposed at their intersection position. The storage cells 12 connected in parallel to the common sense bit lines 21A and 21B make up the bit row Yn and the storage cells 12 cascaded to the common sense word line 31 make up the word row Xn. In one storage cell 12, the magneto-resistance effect element 12A, 12B is connected at one end to the sense bit line 21A, 21B via the read sensing conductor 11 and is connected at an opposite end to the common sense word line 31 via the blocking diode 13A, 13B.

A current-voltage conversion resistor 23A, 23B (simply, resistor 23A, 23B) and the collector-emitter of a transistor 22A, 22B are connected in series to one end of the sense bit line 21A, 21B (power supply Vcc side). The transistor 22A, 22B has a base to which the bit decode line 20 is connected, and has a switching function for opening or closing in response to the selection signal value input from the bit decode line 20 (bit decode value).

A sense amplifier input line 40A, 40B (simply, input line 40A, 40B) is derived from the connection point at the end of the resistor 23A, 23B connected to the sense bit line 21A, 21B opposite to the power supply Vcc. Here, the resistor 23A, 23B functions as bias resistance of the sense amplifier 106B. The sense amplifiers 106B are provided in a one-to-one correspondence with the bit direction unit read circuits 80; the sense amplifier 106B itself functions as a differential amplifier for inputting the potential difference between the sense bit lines 21A and 21B and amplifying the potential difference. Each sense amplifier 106B is connected to the corresponding to the sense bit lines 21A and 21B by the input lines 40A and 40B and all sense amplifiers 106B are cascaded to common sense amplifier output lines 41A and 41B (simply, output lines 41A and 41B) and last are connected to the output buffer 102B by the read data bus 112. In the transistors 22A and 22B, the resistors 23A and 23B, and the sense amplifiers 106B, the paired elements need to have characteristics well matched.

The storage cells 12 arranged in the same word row Xn (X1, X2, . . . ) are connected to each of the sense word lines 31 (here, however, the blocking diodes 13A and 13B are disposed between the storage cell 12 and the sense word line 31). The collector-emitter of a transistor 33 and a current limit resistor 34 are connected in series to the ground side of the sense word line 31. The transistor 33 has a base to which the word decode line 30 ( . . . , 30n, 30n+1, . . . ) corresponding to the word row Xn is connected, and functions as a switch for opening or closing in response to the selection signal value input from the X direction address decoder 108A to the base (word decode value).

Here, diodes, the transistor 33, and the current limit resistor 34 make up the constant current circuit 108B. The constant current circuit 108B has a function of making constant the current flowing through the sense word line 31. The diodes 32 are two diodes connected in series.

Next, the circuit layout pattern of the magnetic memory device in the embodiment will be discussed with reference to FIGS. 10 to 12.

Figure 10:
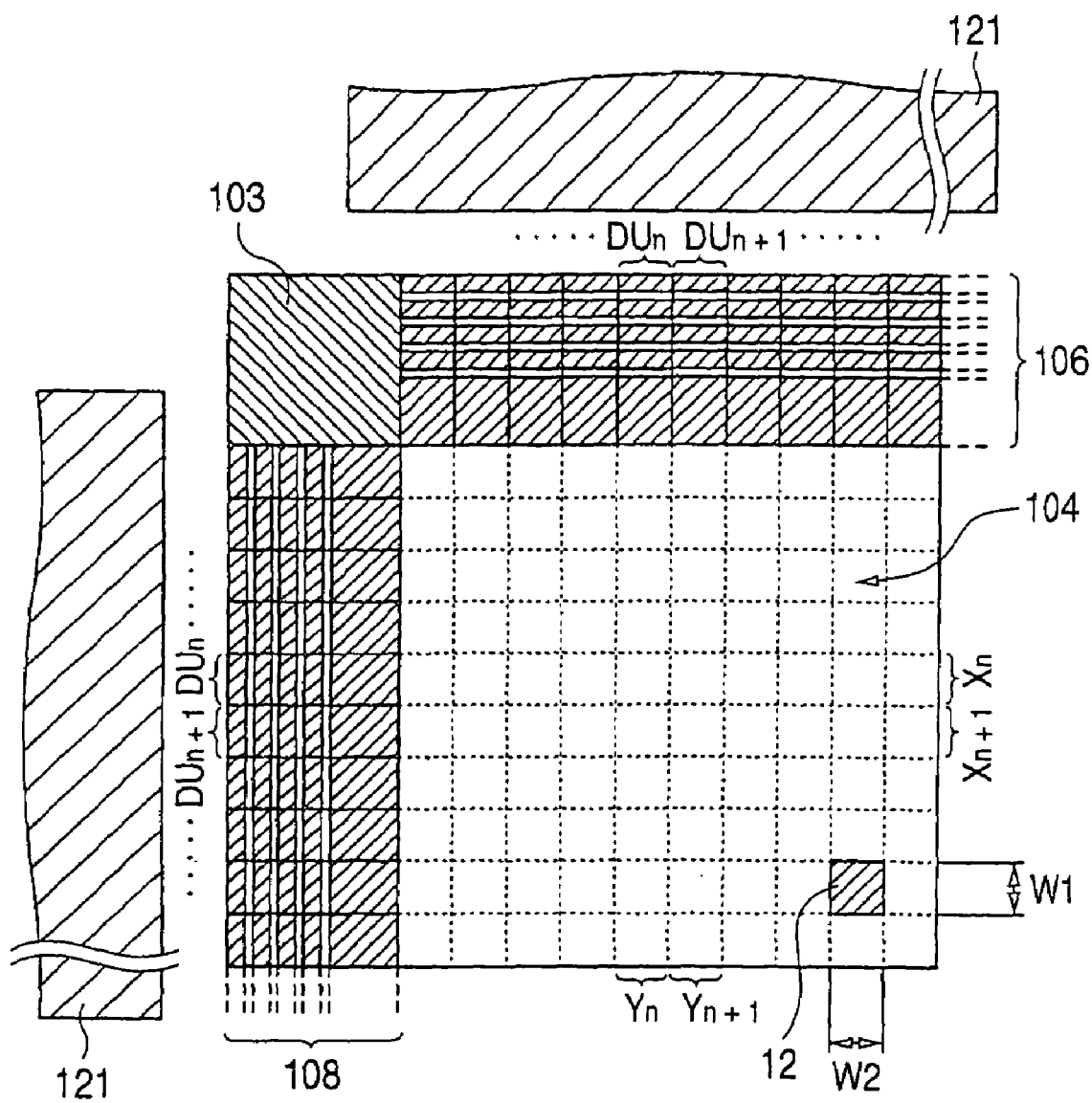
FIG. 10 is a drawing to represent how drive circuit sections surrounding the storage cell unit shown in FIG. 1 are installed.

FIG. 10 represents how the drive circuit sections surrounding the storage cell unit are installed. The X direction drive circuit section 108 is formed on one side of the storage cell unit 154 and the Y direction drive circuit section 106 is formed on another side. The bonding pads 121 are provided in the outer regions of the drive circuit sections. Here, in the X direction drive circuit section 108, the X direction address decoder 108A, the constant current circuit 108B, and the X direction current drive 108C corresponding to each word row Xn (X1, X2, . . . ) form one component unit. Likewise, in the Y direction drive circuit section 106, the Y direction address decoder 106A, the sense amplifier 106B, and the Y direction current drive 106C corresponding to each bit row Yn (Y1, Y2, . . . ) form one component unit. Here, one component unit of the X direction drive circuit section 108, the Y direction drive circuit section 106 is a unit drive circuit DUn (DU1, DU2, . . . ) corresponding to each word row Xn, each bit row Yn. The width of the unit drive circuit DUn in the X direction, the Y direction is formed so as to fit within the dimension of the width of the storage cell 12 (W1 in the X direction, W2 in the Y direction), and the unit drive circuit DUn is placed in the end part of the corresponding word row Xn or bit row Yn.

Figure 11:
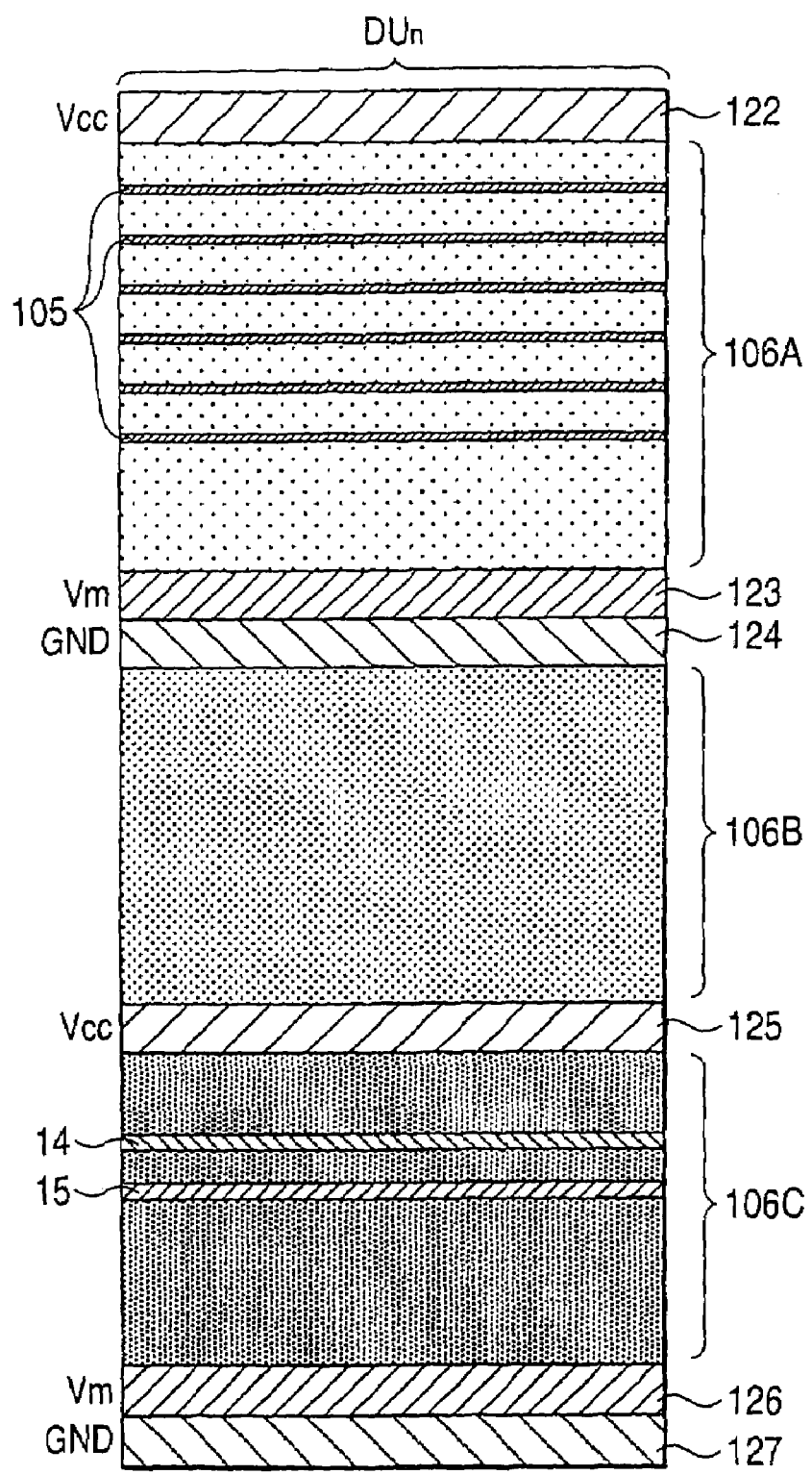
FIG. 11 is a drawing to represent the actual circuit layout of the Y direction drive circuit section shown in FIG. 10.

FIG. 11 represents the circuit layout of the unit drive circuit in the Y direction. The circuit area of the Y direction address decoder 106A is formed between a power supply line 122 (Vcc) and an intermediate-potential power supply line 123 (Vm), ground line 124 (GND). The intermediate-potential power supply line 123 (Vm) gives voltage corresponding to band gap +2φ to a current limiting transistor, etc., as intermediate potential. The power supply line 123 in the X direction also gives intermediate potential to the constant current circuit 108B. The address lines 105 are extended in the circuit area so as to cross the circuit area and the address decoder 106A in each unit drive circuit DUn is connected to the address lines 105. The circuit area of the sense amplifier 106B is formed between a power supply line 125 and the intermediate-potential power supply line 123, ground line 124.

The circuit area of the Y direction current drive 106C is formed between the power supply line 125 and an intermediate-potential power supply line 126, ground line 127. The data signal line 14 and the reference signal line 15 are extended in the circuit area so as to cross the circuit area and the current drive 106C in each unit drive circuit DUn is connected to the signal lines.

The circuit-layout of the unit drive circuit DUn in the X direction is almost similar to that of the unit drive circuit in the Y direction; the circuits 106A, 106B, and 106C of the unit drive circuit in the Y direction correspond to the circuits 108A, 108B, and 108C.

Figure 12:
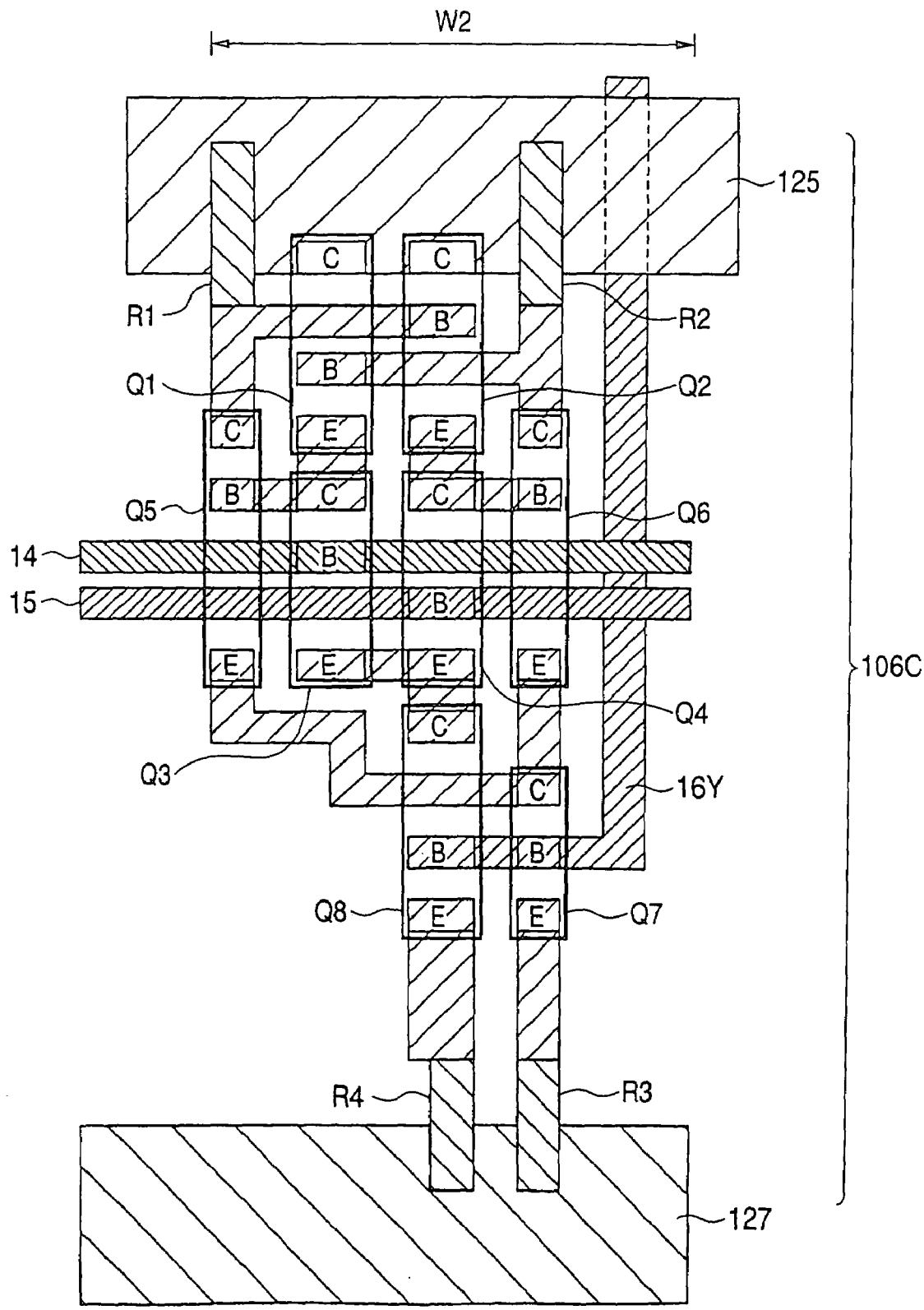
FIG. 12 is a pattern layout drawing of a Y direction current drive in the unit drive circuit shown in FIG. 11.

FIG. 12 specifically shows the circuit pattern layout of only the current drive in the unit drive circuit in the Y direction. The components of the current drive 106C are integrated within the range of the width W2 of the storage cell 12 (the bit decode line 16Y passes through the power supply line 125 and is connected to the Y direction address decoder 106A). It is important on the operation for the three transistor pairs of the transistors Q5 and Q6, Q1 and Q2, and Q3 and Q4 and the resistors R1 and R2 and the resistors R3 and R4 to have characteristics matched; they are placed symmetrically in the actual circuit pattern. The element pairs have characteristics previously matched, of course. Nevertheless, the output characteristics may vary if the temperature condition at the installation location of one circuit element differs from that of another, etc. In contrast, in the embodiment, the paired elements are placed near to each other and symmetrically with each other, so that both receive the same temperature change and thus the mutual characteristics change in a similar fashion and almost no difference occurs. Therefore, output value variations caused by temperature change can be decreased.

The operation of the described magnetic memory device is as follows:

[Write Operation into Storage Cell]

To begin with, the information storage system in the storage cell 12 will be discussed.

Figure 13:
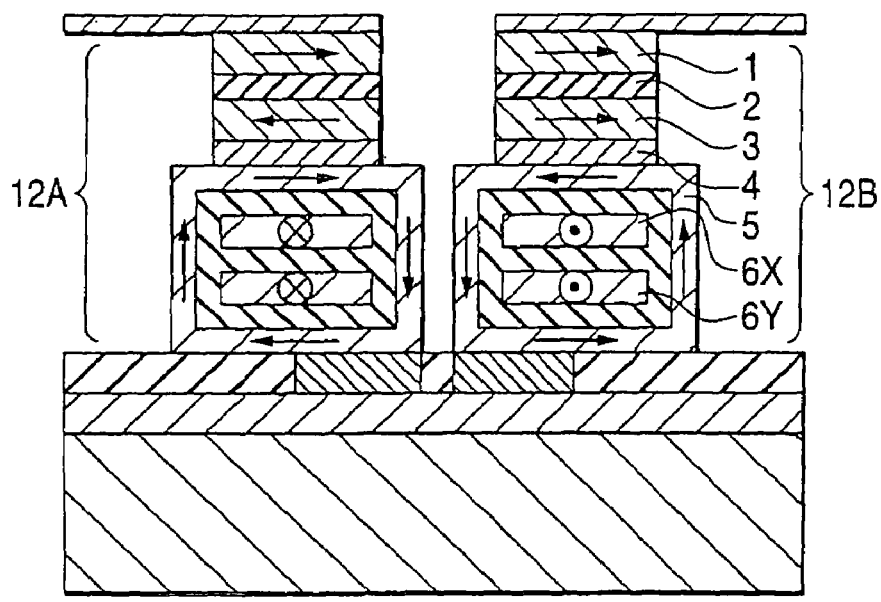
FIG. 13 is a drawing to represent one storage state written into the storage cell shown in FIG. 6.
Figure 14:
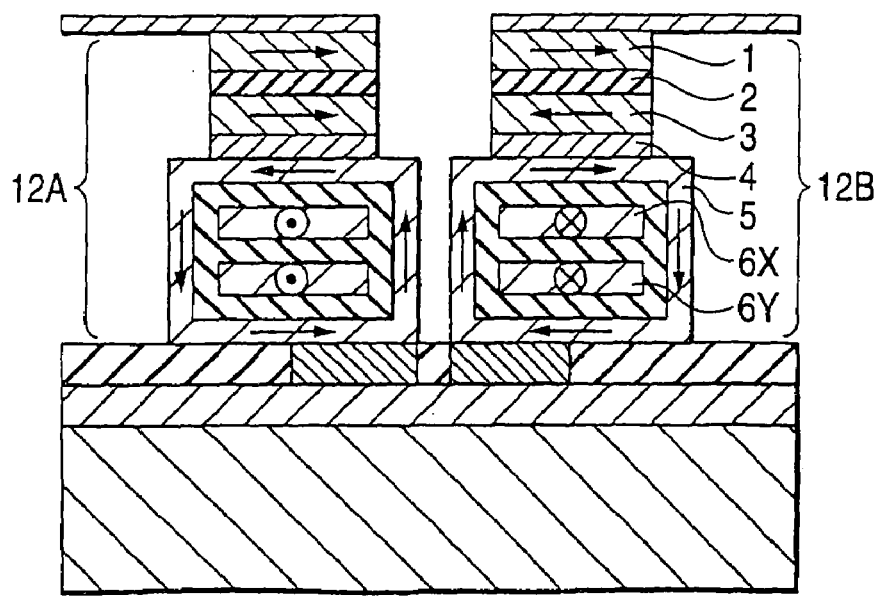
FIG. 14 is a drawing to represent another storage state written into the storage cell shown in FIG. 6.

In the storage cell 12, the first magnetic layers 1 of a pair of the magneto-resistance effect elements 12A and 12B have magnetization fixed to the right direction, but the second magnetic layers 3 are magnetized in directions in which they become antiparallel with each other. Thus, in the magneto-resistance effect element 12A, 12B, the magnetization direction combination of the first magnetic layer 1 and the second magnetic layer 3 always becomes (antiparallel, parallel) or (parallel, antiparallel). FIGS. 13 and 14 represent the states. Here, binary information "0" and "1" are related to the states and the storage cell 12 is placed in either state, whereby one-bit information is stored in the storage cell 12. If the magnetization directions of the first magnetic layer 1 and the second magnetic layer 3 are parallel, the magneto-resistance effect element 12A (12B) becomes a low-resistance state in which a large tunnel current flows; if the magnetization directions are antiparallel, the magneto-resistance effect element 12A (12B) becomes a high-resistance state in which a small tunnel current only flows. This means that one of the magneto-resistance effect elements 12A and 12B always becomes low resistance and the other becomes high resistance, storing information.

The two storage states are written as the magnetization directions of the second magnetic layers 3 of the magneto-resistance effect elements 12A and 12B are made parallel with each other. To do this, relatively opposite direction currents are allowed to flow into the write lines 6X and 6Y in the magneto-resistance effect elements 12A and 12B.

Figure 15:
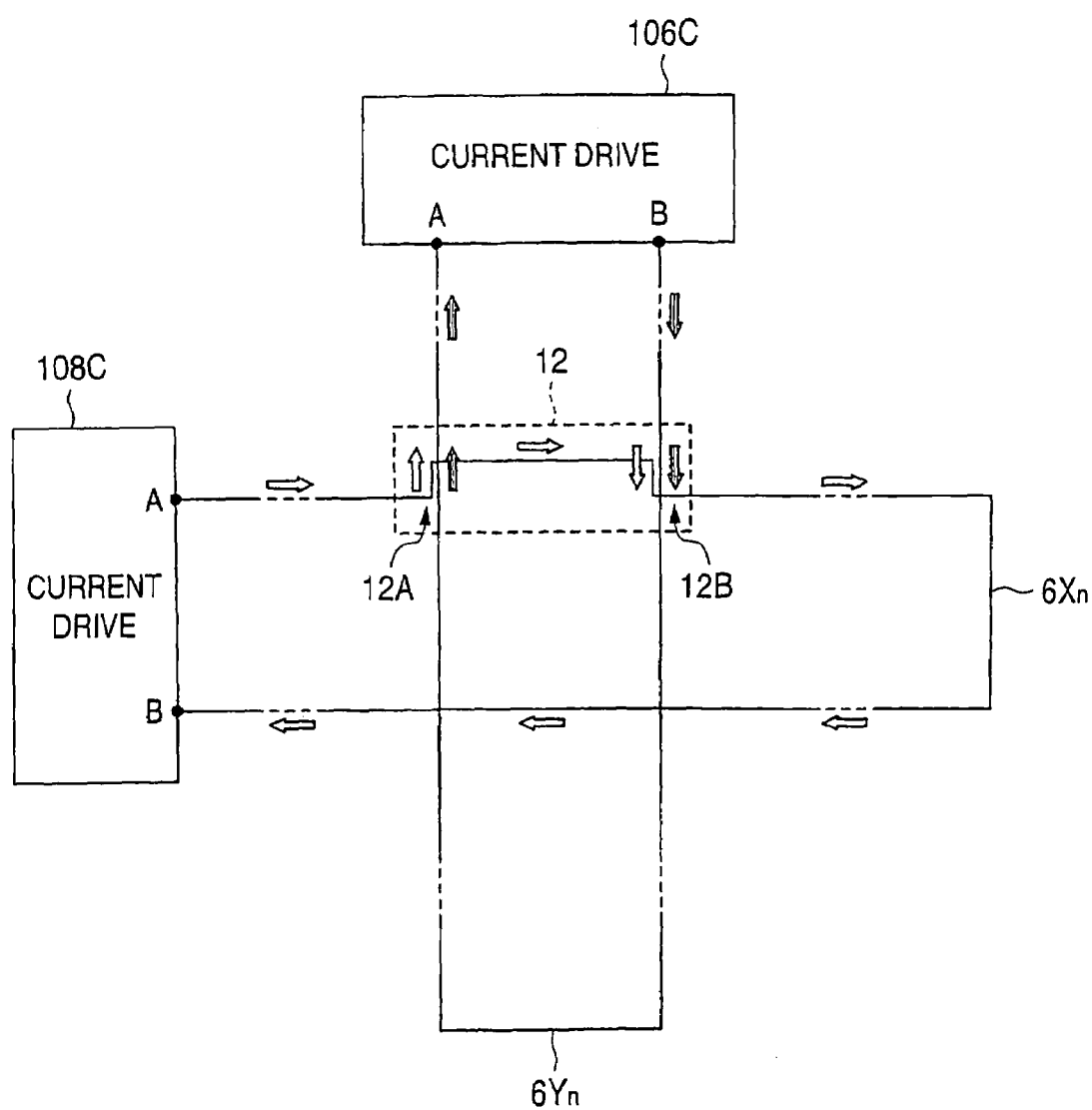
FIG. 15 is a drawing to describe the write operation corresponding to the storage state shown in FIG. 13.

For example, to write the storage state shown in FIG. 13 into the storage cell of bit row Yn, word row Xn, write currents may be allowed to flow as shown in FIG. 15. Thus, if a current is allowed to flow into the write word line 6Xn in the direction of drive point A to B from the current drive 108C and a current is allowed to flow into the write bit line 6Yn in the direction of drive point B to A from the current drive 106C, as the write word line 6Xn is bent, the write currents matched in the direction in the area of the magneto-resistance effect element 12A, 12B and in relatively opposite directions in the magneto-resistance effect elements 12A and 12B flow.

According to the write currents, magnetic fields circulating in opposite directions are induced to the toroidal magnetic layers 5 of the magneto-resistance effect elements 12A and 12B and the magnetization directions on the opposed faces to the second magnetic layers 3 (namely, induced magnetic field directions) become antiparallel with each other, as shown in FIG. 13. The magnetization directions of the second magnetic layers 3 of the magneto-resistance effect elements 12A and 12B become antiparallel in accordance with the externally given magnetic field directions and each magnetization state is fixed by antiferromagnetic bonding with the corresponding toroidal magnetic layer 5. In this case, the magneto-resistance effect element 12A is high resistance and the magneto-resistance effect element 12B is low resistance.

Figure 16:
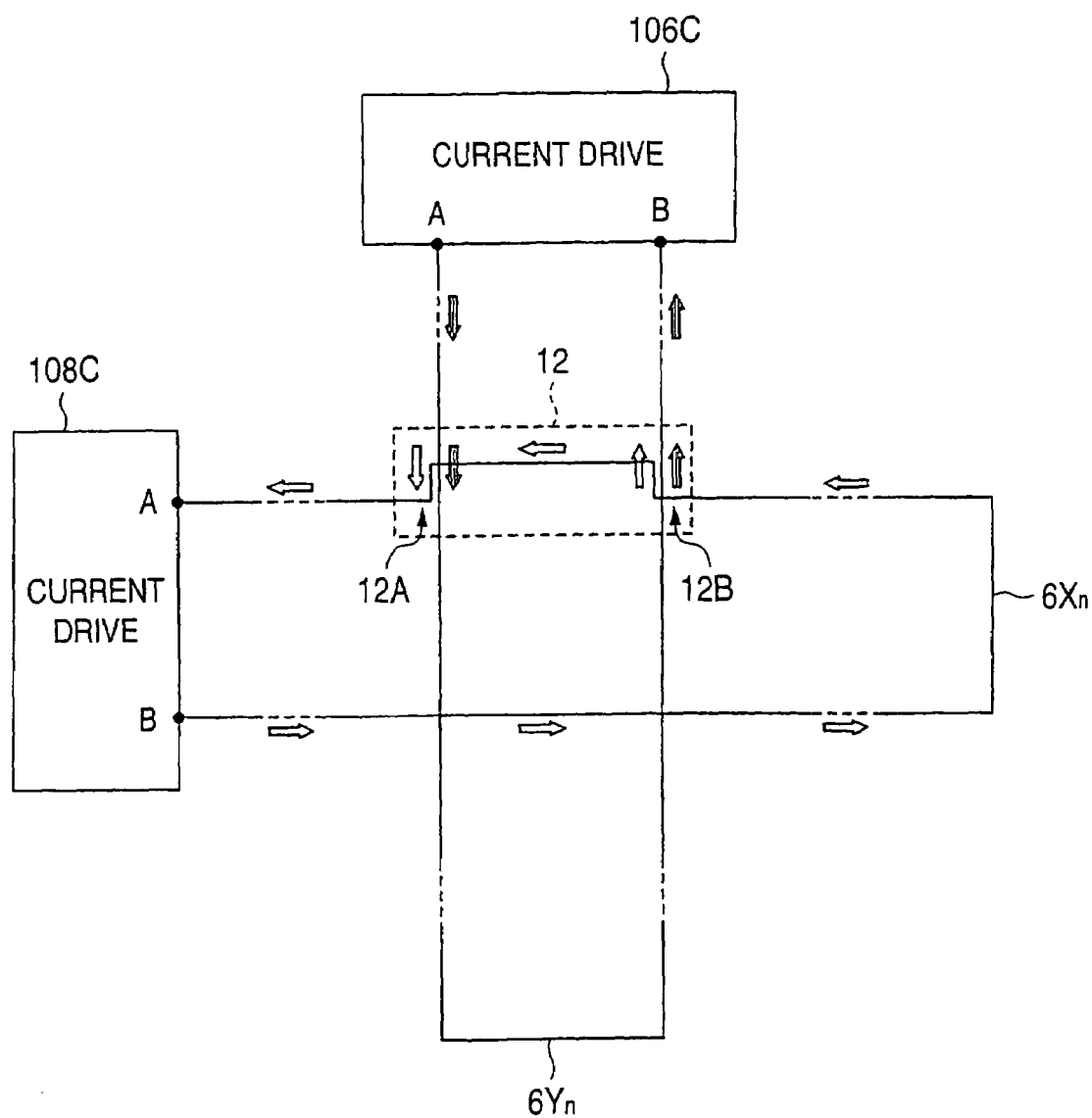
FIG. 16 is a drawing to describe the write operation corresponding to the storage state shown in FIG. 14.

To write the storage state shown in FIG. 14, write currents may be allowed to flow into the magneto-resistance effect elements 12A and 12B in opposite directions to those in the case shown in FIG. 15, as shown in FIG. 16. The storage cell 12 operates as the magneto-resistance effect elements 12A and 12B are switched, and information is written.

Here, the induced magnetic field is trapped in the toroidal magnetic layer 5, so that the effective magnetic field strength contributing to flux reversal of the second magnetic layer 3 increases as compared with that in the related art. Consequently, flux reversal of the second magnetic layer 3 is performed with necessary and sufficient magnetic field strength and the magnetization can be made uniform so as to become a sufficient magnitude in a predetermined direction. Accordingly, efficient write operation can be performed. At the same time, the induced magnetic field does not leak to the outside of the element 12A (12B) to write information, so that the fear that the magnetization direction of the second magnetic layer 3 may be disturbed by an external disturbance magnetic field is decreased in the adjacent storage cell 12 and once written information can be prevented from being erased or rewritten unpredictably. Thus, information can be written reliably.

Next, an information write method conducted based on the information storage system will be discussed.

In the magnetic memory device, first the address buffer 101 inputs the selection signal voltage input to the external address input pins A0 to A20, amplifies the selection signal voltage by the internal buffer amplifier, and transmits the amplified selection signal voltage to the X direction and Y direction address decoders 108A and 106A through the address lines 105 and 107 (FIG. 1). At the same time, the data buffer 102 inputs the data signal voltage input to the external data pins D0 to D7, amplifies the data signal voltage by the internal buffer amplifier, and transmits the amplified data signal voltage to the X direction and Y direction current drives 108C and 106C through the write data buses 110 and 111.

The address decoders 108A and 106A send the decode value corresponding to the selection signal to the corresponding word decode line 16X and the corresponding bit decode line 16Y. Here, the decode value is sent to the word decode line 16Xn and the bit decode line 16Yn. Accordingly, in the current drives 108C and 106C to which the signal is input, the transistors Q7 and Q8 are brought into conduction (FIG. 5) and are selected as the targets to be driven.

The data signal from the data buffer 102 is input to the data signal lines 14 of the current drives 108C and 106C and the signal provided by inverting the data signal is input to the reference signal line 15. Accordingly, the current drives 108C and 106C determine the directions of the currents allowed to flow into the write word line 6X and the write bit line 6Y in response to the binary information to be written.

(Operation of Current Drive)

Figure 17:
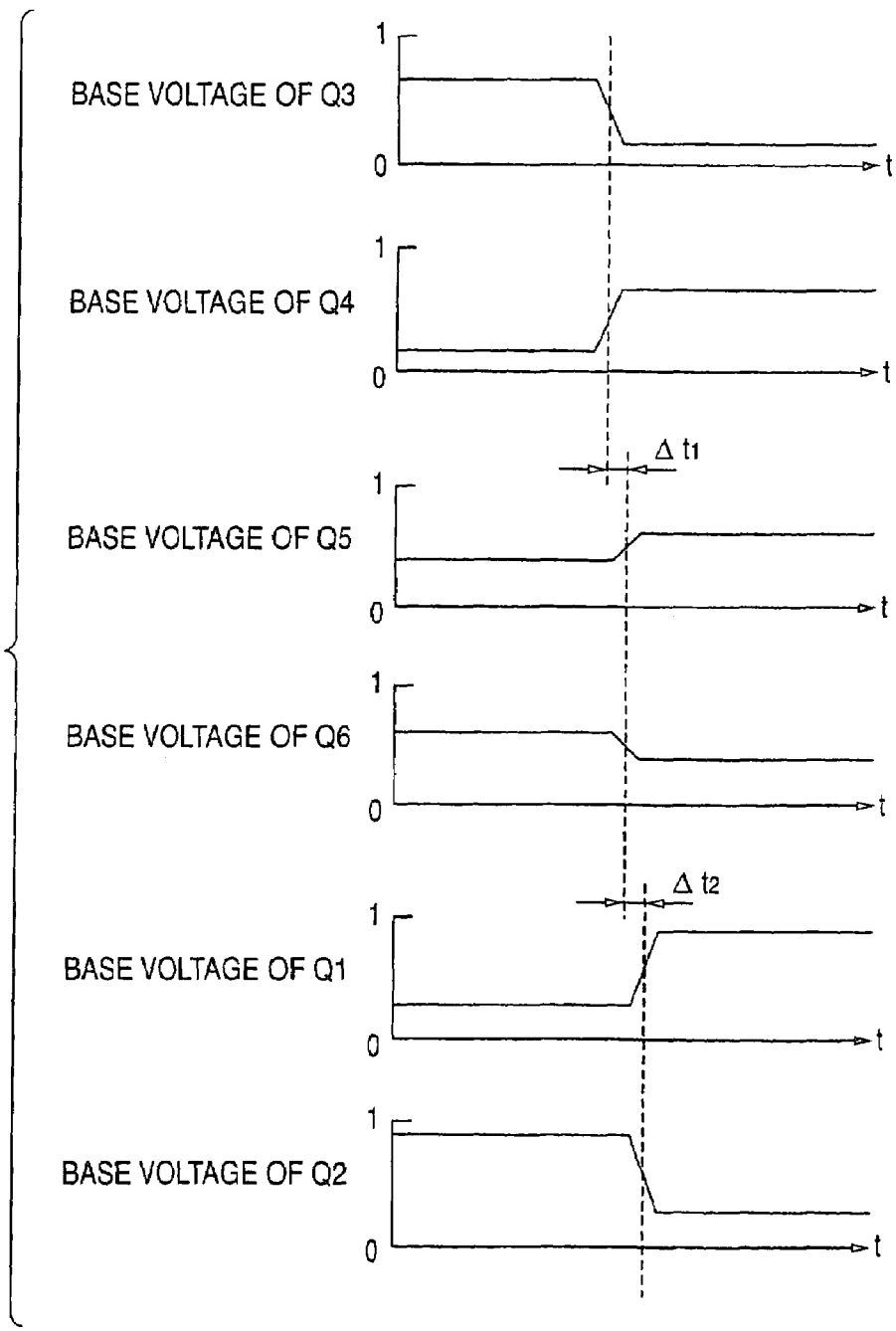
FIG. 17 is a timing chart to represent the operation of the X direction current drive at the write operation time shown in FIG. 15.
Figure 18:
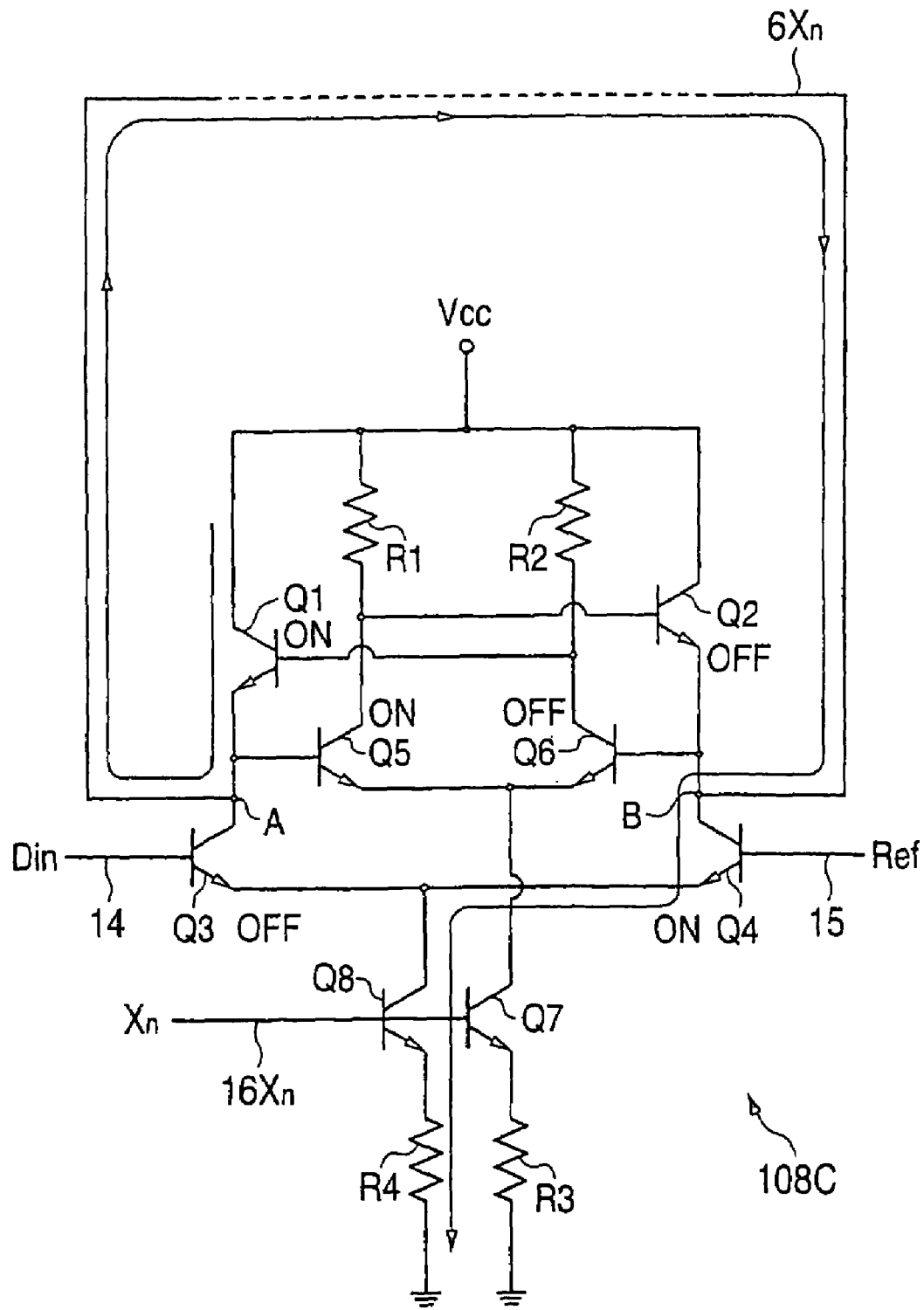
FIG. 18 is a drawing to represent the operation state of each transistor in the X direction current drive at the write operation time shown in FIG. 15 and the path of write current.

The specific operation of the write circuitry will be discussed in conformity with the storage state shown in FIGS. 13 and 15. FIG. 17 is a timing chart in the selected current drive 108C (at the operation time, the transistors Q7 and Q8 are always in conduction state and thus are not shown) Although the following operation steps are caused to occur almost at the same time, it is assumed that minute time Δt1, Δt2 elapses for each step for making a stepwise description. FIG. 18 represents the switching state of each transistor in the current drive 108C of the word row Xn selected.

In the current drive 108C, a low data signal is input to the data signal line 14 and a high reference signal provided by inverting the data signal is input to the reference signal line 15. Accordingly, first a low voltage is given to the base of the transistor Q3 and a high voltage is given to the base of the transistor Q4, turning off the transistor Q3 and turning on the transistor Q4.

When the transistor Q4 is turned on, in the transistor Q6, the base voltage drops and becomes the same as the potential of the emitter. Accordingly, the transistor Q6 is turned off. On the other hand, the transistor Q3 is off and thus in the transistor Q5, a relatively high voltage to the emitter is applied to the base. Accordingly, the transistor Q5 is turned on.

Further, the transistor Q5 is turned on and consequently the base voltage of the transistor Q2 drops and the transistor Q6 is off and thus the base voltage of the transistor Q1 becomes relatively high. Accordingly, the transistor Q1 is turned on in a sense that more current is allowed to flow, and the transistor Q2 is turned off in a sense that only less current flows. That is, in fact, because of the effect of the on/off state of the transistor Q5, Q6 on the voltage level of the base, the transistor Q1 allows much current to flow; whereas the transistor Q2 allows only slight current to flow.

Thus, as the data signal and the reference signal are input, first the transistors Q3 and Q4 of the second differential switch pair operate and the transistors Q5 and Q6 of the third differential switch pair and the transistors Q1 and Q2 of the first differential switch pair operate one after another in response to the operation state of the second differential switch pair, whereby the on/off state of the first differential switch pair (Q1, Q2) and the on/off state of the second differential switch pair (Q3, Q4) become complementary to each other. Which pair is on or off is determined in response to the data signal value.

As the result of the operation sequence of the transistors Q1 to Q6, the current from the power supply Vcc flows through the transistor Q1 which is on in the first differential switch pair, and flows into drive point A. Since the transistor Q3 is off, the current flows from drive point A into the write word line 6Xn, flows out from drive point B, passes through the transistor Q4 which is on, and flows into the ground side.

That is, as the transistor Q1 is turned on and the transistor Q2 is turned off in the first differential switch pair, drive point A is selected to the current inflow side of the write word line 6Xn. On the other hand, in the second differential switch pair, the transistor Q3 is turned off and the transistor Q4 is turned on complementarily to the first differential switch pair, so that drive point B on the opposite side is selected to the current outflow side of the write word line 6Xn. Thus, the write current in the direction of drive point A to B is supplied from the current drive 108C to the write word line 6Xn.

As understood from the description of the operation, the write current path made up of the first and second differential switch pairs (Q1 to Q4) and the write word line 6Xn and the path of the current flowing into the third differential switch pair (Q5 and Q6) are independent of each other. The write current path is grounded through the transistor Q8 and the resistor R4 and the path of the current flowing into the third differential switch pair is grounded through the transistor Q7 and the resistor R3.

Here, letting the resistance value of the resistor R4 be Rc, magnitude I of the write current flowing into the path of the transistor Q8 and the resistor R4 is given according to the following expression:

$$I(A) = (Vb - \phi')(\text{volts})/Rc(\Omega) \tag{1}$$

where Vb is the voltage level input to the base of the transistor Q8 and $\phi'$ is forward voltage between the base and emitter of the transistor Q8. Since these are fixed values, it is seen that if the resistance value Rc is determined, the flowing current becomes a constant value and that the current value can be determined uniquely with the resistance value Rc as a parameter. Thus, the transistor Q8 acts not only as the decode switch, but also as a constant current circuit for directly controlling the current together with the resistor R4.

Accordingly, the write current has a value fixed on the path where it flows out from the write word line 6Xn and thus always flows in a constant value in the write word line 6Xn.

In the current drive 108C of the embodiment, the current flowing into the write word line 6X is always controlled to a constant value. Thus, if the resistance value of the write word line 6X varies, the potential difference between drive points A and B changes in conjunction. In the case where the current is driven as in the example, the larger the resistance value of the write word line 6X, the higher the potential of drive point A and the lower the potential of drive point B, attempting to hold the current amount flowing into the write word line 6X constant. At this time, the potential of drive point A is close to the power supply voltage because the transistor Q1 is on and the transistor Q3 is off; the potential of drive point B is close to the emitter potential of the transistor Q4 because the transistor Q2 is off and the transistor Q4 is off. That is, once the data signal and the reference signal are input and the emitter potentials of the transistors Q3 and Q4 are determined, the potential of each of drive points A and B has a value determined between the power supply voltage and the emitter voltage with the operation of the transistors Q1 to Q6 independently of the input signal voltage of the data signal, the reference signal, etc. Therefore, the potential difference between drive points A and B can be varied widely.

Such potential variation has an effect on the base voltages of the transistors Q5 and Q6 at the same time. The transistor Q5 allows more current to flow and the transistor Q6 allows less current to flow; the open and closed balance of the differential pair is inclined more largely. Consequently, the base potential of the transistor Q2 lowers and if the potential lowers at the emitter connected to drive point B, the transistor Q2 can be held off. Likewise, the base potential of the transistor Q1 rises and if the potential rises at the emitter connected to drive point A, the transistor Q1 can be held on. Thus, if the potential difference between drive points A and B (resistance value of write word line 6X) varies, the third differential switch pair (Q5 and Q6) acts as a differential amplifier for automatically making a fine adjustment to the operation state of the first differential switch pair (Q1 and Q2) in response to the potential variation, so that the whole open and closed balance of the first to third differential switch pairs (Q1 to Q6) can be continuously held proper and the wide potential variation between drive points A and B described above can be ensured.

Thus, the current drive 108C performs constant current control as well as current direction control for selecting one end as the current inflow side and the other as the current outflow side for the write word line 6Xn having both ends drawn into drive points A and B, and stably supplies constant current in the direction of drive point A to B. Such action is also applied to each of the current drives 108C and 106C for other write lines 6X and 6Y.

On the other hand, the current drive 106C selected in this case allows current to flow into the write bit line 6Yn in the direction of drive point B to A. To do this, a high data signal may be input to the data signal line 14 and a low reference signal may be input to the reference signal line 15. Accordingly, the first to third differential switch pairs (Q1 to Q6) switch in an opposite manner to that in the current drive 108C and the write current flows from the transistor Q2 into drive point B, passes through the write word line 6Xn, flows out from drive point A, and flows into the transistor Q3.

Thus, the current drives 108C and 106C supply the write currents in the directions shown in FIG. 15 to the write word line 6Xn and the write bit line 6Yn. Accordingly, the storage cell of bit row Yn, word row Xn is selected and the bit data represented in the state in FIG. 13 is written into the storage cell 12 in accordance with the direction of the supplied write current. The write current at this time always becomes a predetermined value, so that the write operation is performed stably.

Another storage state of the storage cell shown in FIG. 14 is written as the write currents in the magneto-resistance effect elements 12A and 12B are supplied in opposite directions to those in FIG. 15 described above, as shown in FIG. 16. That is, the current drive 108C allows current to flow into the write word line 6Xn in the direction of drive point B to A, and the current drive 106C allows current to flow into the write bit line 6Yn in the direction of drive point A to B.

To do this, a high data signal may be input to the data signal line 14 of the current drive 108C and a low reference signal may be input to the reference signal line 15. Accordingly, the transistors Q1 to Q6 of the current drive 108C switch to the opposite state to that described above and the write current flows from the transistor Q2, passes through the write word line 6Xn, and flows into the transistor Q3. In contrast with the current drive 108C at this time, a low data signal is input to the data signal line 14 of the current drive 106C and a high reference signal is input to the reference signal line 15 for drive. Accordingly, in the storage cell 12, the magnetization directions of the second magnetic layers 3 of the magneto-resistance effect elements 12A and 12B become antiparallel so as to face each other.

In the magnetic memory device, the current drives 108C, 106C are integrated in the areas each of the same width W1, W2 as the storage cell 12, so that the paired elements also become almost equal in temperature change during the operation. Accordingly, variation of the write current value occurring due to temperature change during driving is suppressed.

[Read Operation]

In the magnetic memory device, the information written into the storage cell 12 is read as follows (see FIG. 9):

In each storage cell 12, information is stored with the magneto-resistance effect elements 12A and 12B entered in either of the two types of antiparallel magnetization. The storage cell 12 from which information is to be read is selected as the Y direction selection signal is input to the bit decode line 20 and the X direction selection signal is input to the word decode line 30 corresponding to the address of the storage cell 12. For example, the storage cell 12 to be selected is in Yn column, Xn row, the signals are input to the Yn'th bit decode line 20n and the Xn'th word decode line 30n.

Assuming that the voltage level on the bit decode line 20n is high, the transistors 22A and 22B are brought into conduction and sensing currents flow into the Yn'th column direction block (bit row Yn) of the storage cell 12. The sensing currents flow through the sense bit lines 21A and 21B from the power supply Vcc side down to its opposite side. On the other hand, assuming that the voltage level on the word decode line 30n is high, the transistor 33 is brought into conduction and current is allowed to flow into the Xn'th row direction block (word row Xn) of the storage cell 12.

Thus, the sensing currents pass through the magneto-resistance effect element 12A and the diode 13A and the magneto-resistance effect element 12B and the diode 13B from the Yn'th sense bit lines 21A and 21B and flow into the Xn'th sense word line 31 and further pass through the collector-emitter of the transistor 33 forming a part of the constant current circuit 108B and exit from the resistor 34 to ground.

To read information, the difference between the values of the currents flowing into the magneto-resistance effect elements 12A and 12B of the storage cell 12 is detected. The currents flowing into the elements are almost equal to the $sensing currents flowing through the sense bit lines 21A and 21B, and the values of the sensing currents can be detected as the sensing currents are converted into voltages based on voltage drops of the resistors 23A and 23B connected in series to the sense bit lines 21A and 21B. Then, here, as read signal, the voltage drops of the resistors 23A and 23B are taken out from the input lines 40A and 40B and the difference therebetween is detected. Thus, the two magneto-resistance effect elements 12A and 12B are used and the difference between the output values is taken out, whereby a large output value with noise removed can be provided as the storage cell 12.

Further, the potential difference taken out from the input lines 40A and 40B is differentially amplified by the sense amplifier 106B, whereby a larger value with good S/N can be output. The sense amplifiers 106B of the bit direction unit read circuits 80 ( . . . , 80n, 80n+1, . . . ) are cascaded to the output lines 41A and 41B. The corresponding sense amplifier 106B is activated at the same time as the bit decode line 20 is selected, and only collector output is sent to the output lines 41A and 41B.

Output of the sense amplifier 106B is finally input to the output buffer 102B via the output lines 41A and 41B and the read data buffer 112. The output buffer 102B amplifies the input signal voltage and outputs the amplified signal voltage from the external data pins D0 to D7 as a binary voltage signal.

In the read operation, the magnitude of each sensing current for the selected storage cell 12 is placed within a constant range by the constant current circuit 108B. That is, the sum total of the current flowing into the sense word line 31, the sense bit lines 21A and 21B, or the magneto-resistance effect elements 12A and 12B takes a value in a certain range. Accordingly, the current value of each of the sense bit lines 21A and 21B becomes the current value resulting from distributing constantly standardized current amount in response to the resistance ratio between the magneto-resistance effect elements 12A and 12B. Thus, if the resistance value of the magneto-resistance effect element 12A, 12B varies, fluctuation of the current in each of the sense bit lines 21A and 21B is always suppressed within a constant range in response to the total current value, and stable differential output can be provided.

The diodes 13A and 13B provided on the current paths of the magneto-resistance effect elements 12A and 12B prevent currents from flowing back to the magneto-resistance effect elements 12A and 12B from the sense word line 31. Thus, the occurrence path of a throwing power current component back flowing through the magneto-resistance effect element 12A (12B) is shut off, contributing to improvement in the S/N ratio of the read signal.

Thus, in the embodiment, the current drive 108C, 106C is configured so that both ends of the write line 6X, 6Y are drawn into drive points A and B and (1) the current direction is switched to the direction responsive to the data signal and current is allowed to flow into the loop and (2) the current amount is controlled to provide constant current after flow out from the write line. Thus, the current can be supplied bidirectionally in a constant magnitude independently of resistance variations. Therefore, in the magnetic memory device, to write information into each storage cell 12, constant current is always used, so that the information can be reliably written by an induced magnetic field of sufficient strength and the leaked magnetic field to the adjacent storage cell 12 can be suppressed within the setup range under good control; the stable write operation can be performed. As the write lines go finer with high integration of the storage cells, it is conceivable that the resistance variations in manufacturing the write lines will still more grow, and the effect of the resistance variations on the write current will become more obvious in the future. The current drives 108C and 106C can cope with such a case and can demonstrate the advantages still more.

Since the current drive 108C, 106C is designed to control the current direction by operation of the differential switch pairs of the transistors Q1 to Q6, the write current undergoes direction control in the different system from that in the related art. Particularly, the transistors Q5 and Q6 are provided and operate as the differential amplifier for controlling the open/closed state of the transistors Q1 and Q2, so that the transistors Q1 and Q2 perform the switching operation in the strength well following the potential difference between drive points A and B. Moreover, the transistors Q1 and Q2 follow wide potential fluctuation between drive points A and B by the transistors Q5 and Q6. Thus, if the resistance values of the write lines 6 largely vary, while the current amount into each write line 6 is held constant, the balance of the open/closing operation for current direction control can also be maintained.

It is guaranteed that the write current value is constant independently of resistance variation for each write line 6, etc., and wide resistance variations of the write lines 6 are allowed as mentioned above. Thus, the allowable range of a manufacturing error of the write line 6 is widened and the flexibility of the write line wiring structure is enhanced. For example, it is extremely difficult to control the line width, the width, and the thickness of a fine write line constant in the manufacturing process; no requirement for the ultimate dimension accuracy is very advantageous on production. On the actual wiring, the write lines may vary in length or shape depending on the position; even in such a case, the layout need not be changed and further it is also possible to lay out such a wiring structure intentionally. When memory will be highly integrated and the wiring density will be enhanced in the future, it is considered that such a technique is used effectively.

Each of the current drives 108C and 106C is made up of only the transistors Q1 to Q8 and the resistors R1 to R4, so that the write current supply channel can be extremely simplified as compared with that in the related art. Therefore, if the current drives 108C, 106C are provided in a one-to-one correspondence with the word rows Xn, bit rows Yn, a large circuit space is not required.

In addition, the current drive in the related art includes an analog circuit (constant current control section) and digital circuit (logic section and pulse generation section) which are mixed; however, the current drive 108C, 106C in the embodiment is configured as an analog circuit using the bipolar transistors Q1 to Q8. The advantage lies in that the current amount can be finely adjusted in an analog manner in the bipolar transistor while the MOS transistor has a feature of digital switching operation. As previously described, for the transistors Q5 and Q6 and the transistors Q1 and Q2, the paired elements differentially amplify the relative greater-than or less-than relation between the voltages at the bases of the elements and perform the switching operation in the strength responsive to the potential difference between drive points A and B, thereby holding the operation state. The bipolar transistor is well fitted for such intermediate operation, and the current amount can be controlled directly.

Further, the current drives 108C, 106C are patterned according to the width W1, W2 of the storage cell 12 so that each corresponds to each word row Xn, each bit row Yn, and the current drives 108C and 106C are integrated in one circuit area, so that the paired circuit elements of the components of the current drive are formed near to each other. Thus, the paired circuit elements are driven under a similar temperature condition, so that characteristic variations caused by temperature change can be suppressed and noise in the current drive 108C, 106C can be prevented.

[Modification Examples]

Modification examples of the embodiment described above will be discussed.

[First Modification Example]

Figure 19:
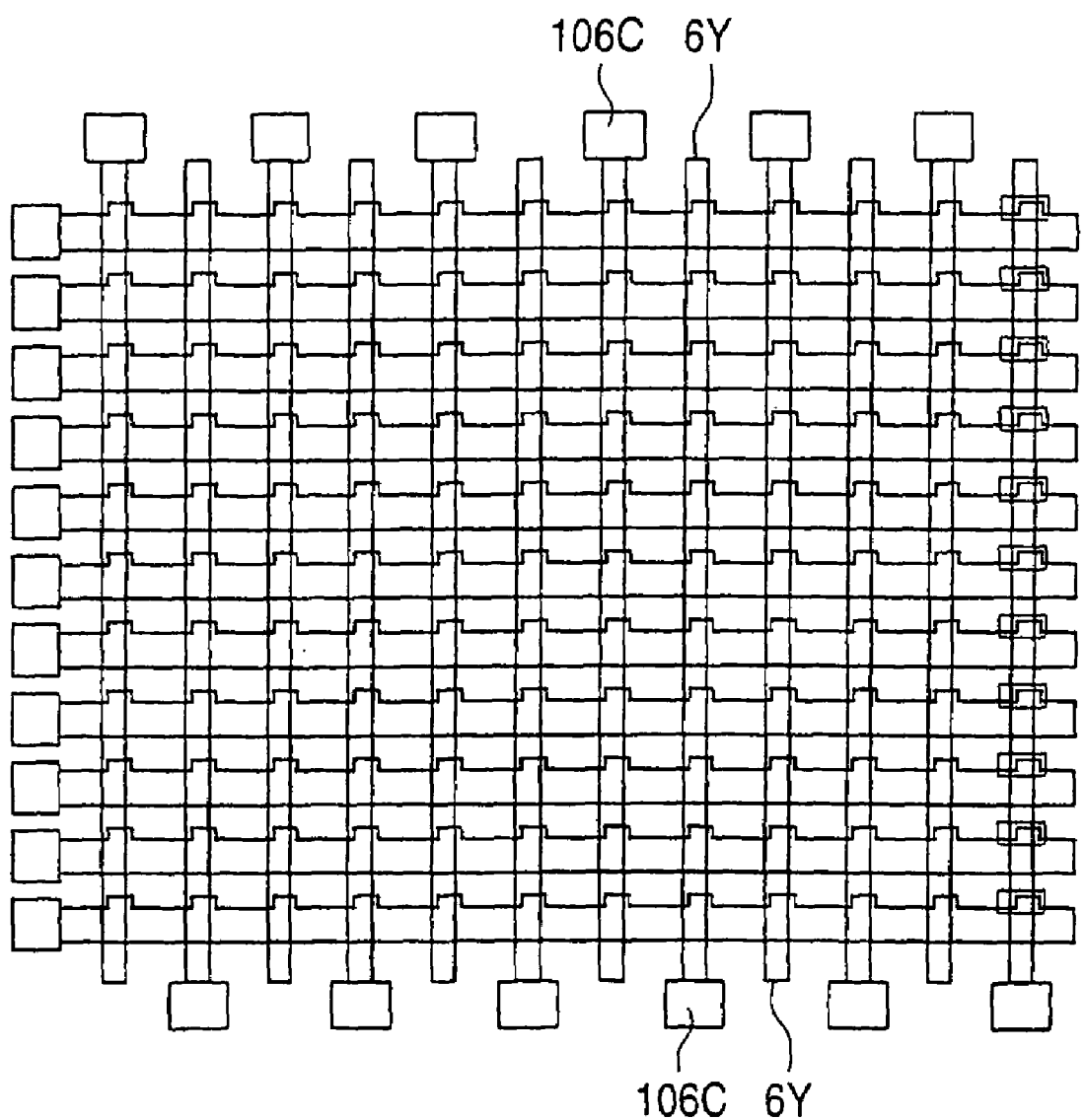
FIG. 19 is a diagram to represent a configuration example of the write circuitry shown in FIG. 3.

FIG. 19 represents a modification example concerning the layout of current drives. In the above-described embodiment, all current drives 106C are arranged on the top side of the storage cell unit 104. However, if the circuit size becomes large exceeding the width W2 of the storage cell 12, the current drives 106C may be disposed in a staggered manner on both the top and bottom sides, as shown in FIG. 19. Only a return of a write current 6Y exists between the adjacent current drives 106C and if the free space is used as a circuit space, the current drives 106C can be provided in a one-to-one correspondence with bit rows Yn. Such modification can also be made for current drives 10C and is applied to either or both of the current drives 108C and the current drives 106C in response to the circuit layout. Further, in the embodiment, the current drives 108C and 106C are components of X direction and Y direction unit drive circuits DUn and therefore the modification example may be applied to the layout of the unit drive circuits DUn in an expanded manner.

FIGS. 20 to 23 represent modification examples concerning the configuration of a current drive.

(Second Modification Example)

Figure 20:
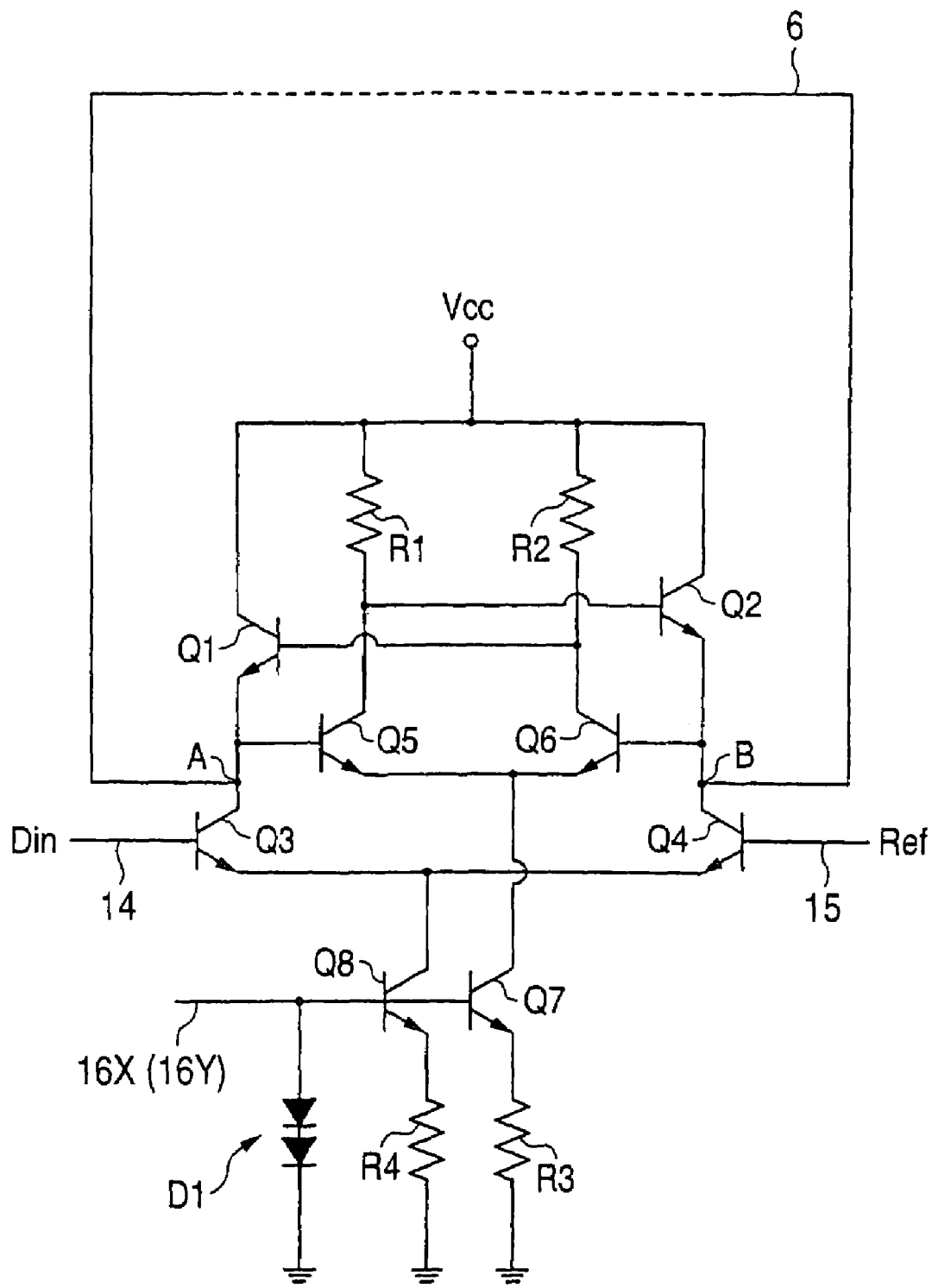
FIG. 20 is a circuit diagram of a modification example of the current drive shown in FIG. 5.

In FIG. 20, diodes D1 are provided between the base of a transistor Q8 and ground. The diodes D1 are two diodes connected in series, for example, and have a function of making the base voltage of the transistor Q8 constant when a decode value is input. In the embodiment, the decode signal value input to the base of the transistor Q8 is constant and thus such constant voltage elements are not required; however, if the stability of the decode signal value is not ensured, the diodes D1 may be used to aggressively fix the base voltage of the transistor Q8 for enhancing constant current control between the collector and emitter of the transistor Q8.

(Third Modification Example)

Figure 21:
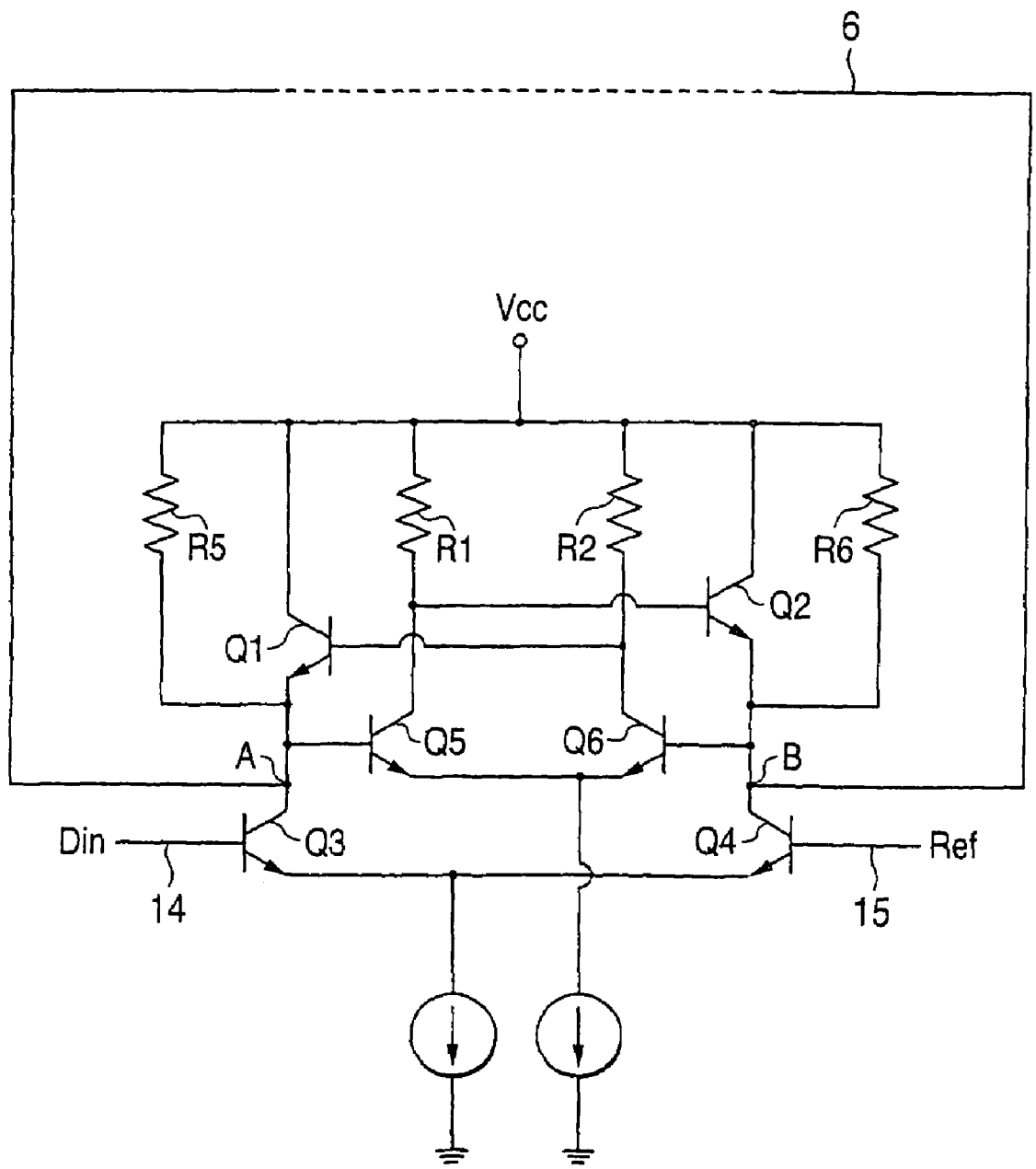
FIG. 21 is a circuit diagram of a modification example of the current drive shown in FIG. 5.

In FIG. 21, resistors R5 and R6 are connected in parallel between the collector-emitter of a transistor Q1 and the collector-emitter of a transistor Q2. In the third to fifth modification examples, the circuit portion on the ground side from each differential switch pair is represented equivalently as constant current source. The specific configuration of the portion may be similar to that in the embodiment or may be a modification of diodes D1, etc., as in the second modification example.

The resistors R5 and R6 have a function of adjusting each potential of drive points A and B to a predetermined value as the voltage of the resistor drops. The potential of drive point A, B is an intermediate potential between power supply Vcc and ground and is determined on the circuit design of current drive. However, if the potential needs to be set from the relationship with any other circuit, the resistors R5 and R6 can be provided for adjusting the potential of drive point A, B by setting the potential to the voltage level matched with the voltage drop.

In the embodiment, the data signal and the reference signal are input to the transistors Q3 and Q4. The signals which the operation state of each transistor is controlled based on may be input to the transistors Q1 and Q2 or can be input to four transistors Q1 to Q4.

(Fourth Modification)

Figure 22:
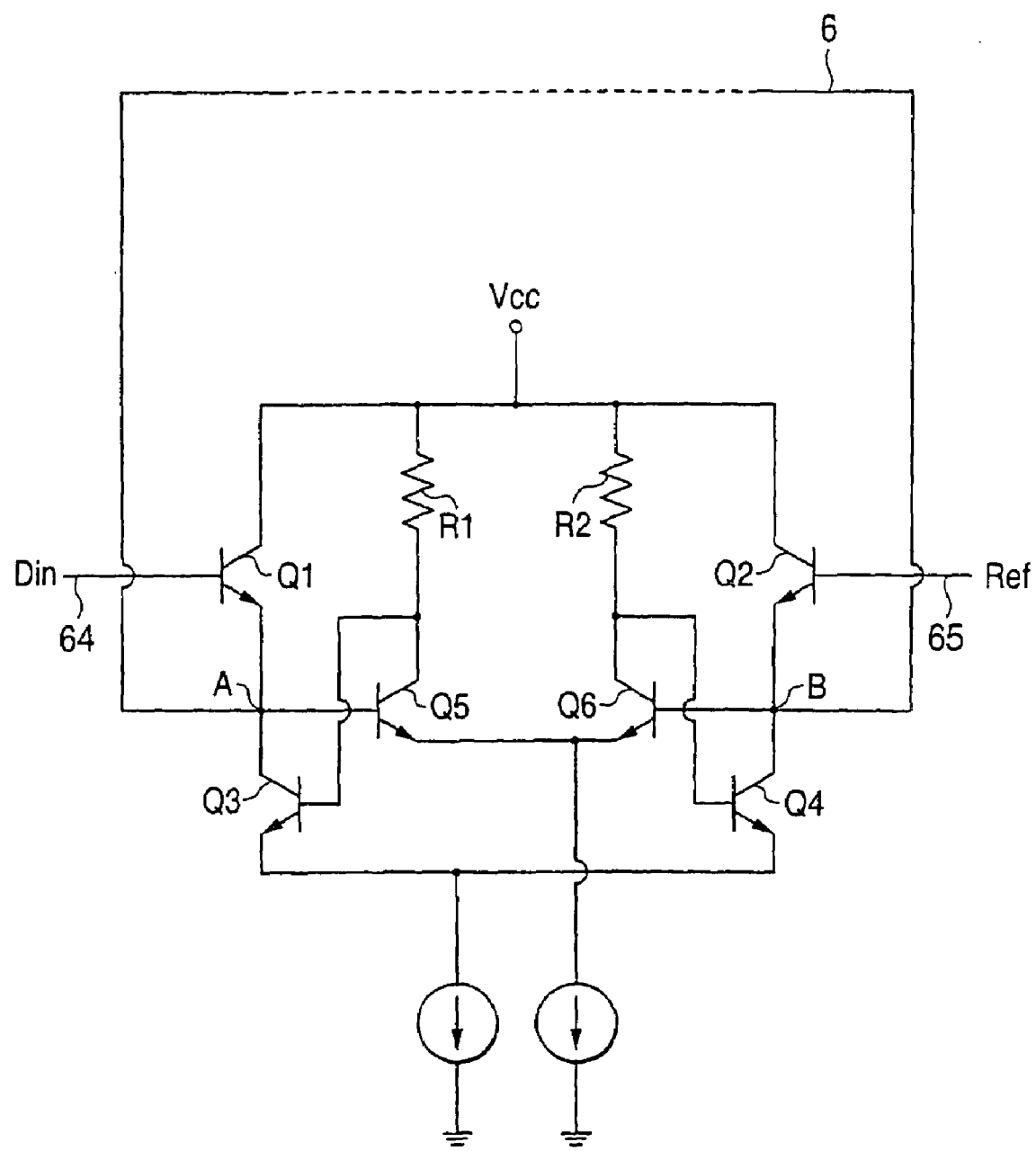
FIG. 22 is a circuit diagram of a modification example of the current drive shown in FIG. 5.

In the modification example shown in FIG. 22, in contrast with the embodiment, bases of transistors Q1 and Q2 are connected to a data signal line 64 and a reference signal line 65 respectively and the base of a transistor Q3 is connected to an intermediate point between the collector of a transistor Q5 and a bias resistor and the base of a transistor. Q4 is connected to an intermediate point between the collector of a transistor Q6 and a bias resistor. In this case, first, if the transistors Q1 and Q2 operate in response to the data signal and the reference signal, the state is differentially sensed by the transistors Q5 and Q6 and further the operation of the transistors Q3 and Q4 is controlled based on the sensing result. In the modification example, the base voltages of the transistors Q5 and Q6 change depending on whether the transistors Q1 and Q2 are on or off, and the transistors Q5 and Q6 become the same operation state as the transistors Q1 and Q2. The operation state of the transistor Q5 affects the base of the transistor Q3 and the transistor Q3 enters the opposite operation state to that of the transistor Q5. Likewise, the operation state of the transistor Q6 affects the base of the transistor Q4 and the transistor Q4 enters the opposite operation state to that of the transistor Q6. Thus, as compared with the embodiment, the operation procedure of the transistors Q1 to Q6 differs, but consequently switching control of the transistors Q1 to Q4 is performed in a similar manner.

(Fifth Modification Example)

Figure 23:
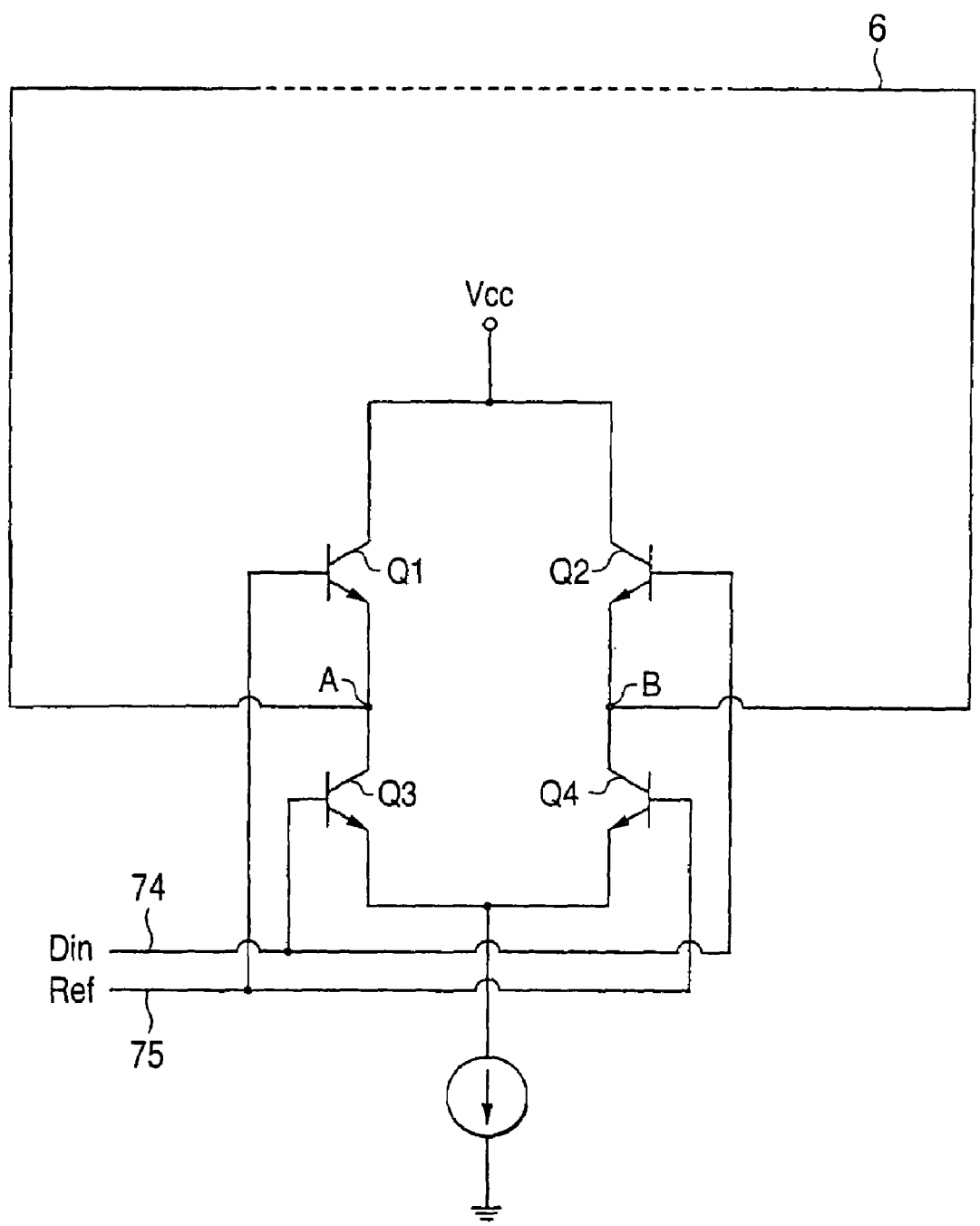
FIG. 23 is a circuit diagram of a modification example of the current drive shown in FIG. 5.

In the modification example shown in FIG. 23, further bases of transistors Q2 and Q3 are both connected to a data signal line 74 and bases of transistors Q1 and Q4 are both connected to a reference signal line 75, so that all of the transistors Q1 to Q4 are controlled by external signal input. Therefore, in this case, the circuit corresponding to "differential control means (or third differential switch pair)" of the invention is not required. In the embodiment, the transistors Q5 and Q6 correspond to the circuit corresponding to "differential control means (or third differential switch pair)." The differential amplification circuit including the transistors Q5 and Q6 is excluded from the current drive of the modification example.

EXAMPLE

[Verification of Constant Current Supply Capability of Current Drive]

Figure 24:
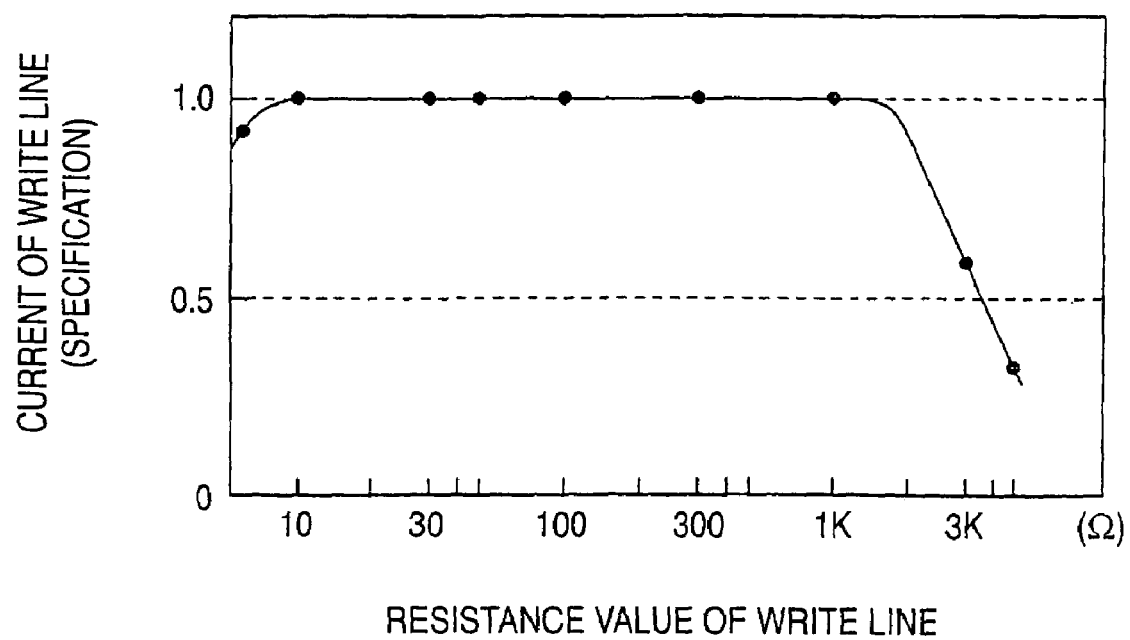
FIG. 24 is a drawing to show the relationship between the resistance values of a write line and the values of current flowing into the write line in write circuitry according to an example of the magnetic memory device of the invention.

The values of current flowing into the write line at the write operation time were measured in a real circuit similar to that in the embodiment (see FIG. 5). To measure the write current value, the resistance value of the write line was changed to check how much the constant current supply capability of the current drive can follow resistance value variations of the write line. FIG. 24 shows the measurement result.

Thus, it is seen that the current drive supplies constant current in spite of the wide resistance value variations ranging from 10 Ω to 1 kΩ. When the resistance value exceeds 1 kΩ, the current amount flowing into the write line decreases with an increase in the resistance value. It is considered that the operation state for supplying the constant current collapses because the voltage drop in the write line becomes large.

The invention is not limited to the specific embodiment and modification examples described above and various changes and modifications can be made in the invention without departing from the spirit and scope thereof. For example, in the magnetic memory device of the embodiment, the current drives 108C and the current drives 106C are configured as the current drives of the invention. However, the current drives of the invention need not necessarily be applied to all current supply circuits and may be used for at least some of the current supply circuits. For example, it is also possible to use the current drives of the invention for either of the X direction current supply circuits and the Y direction current supply circuits. Each of the write lines 6X and 6Y is wiring shaped like a letter U because both ends are connected to the current drive 108C, 106C. However, the write line connected to a current supply source having any other configuration need not be shaped like a letter U, of course, and may be connected at one end and grounded at an opposite end as in the related art.

Figure 25:
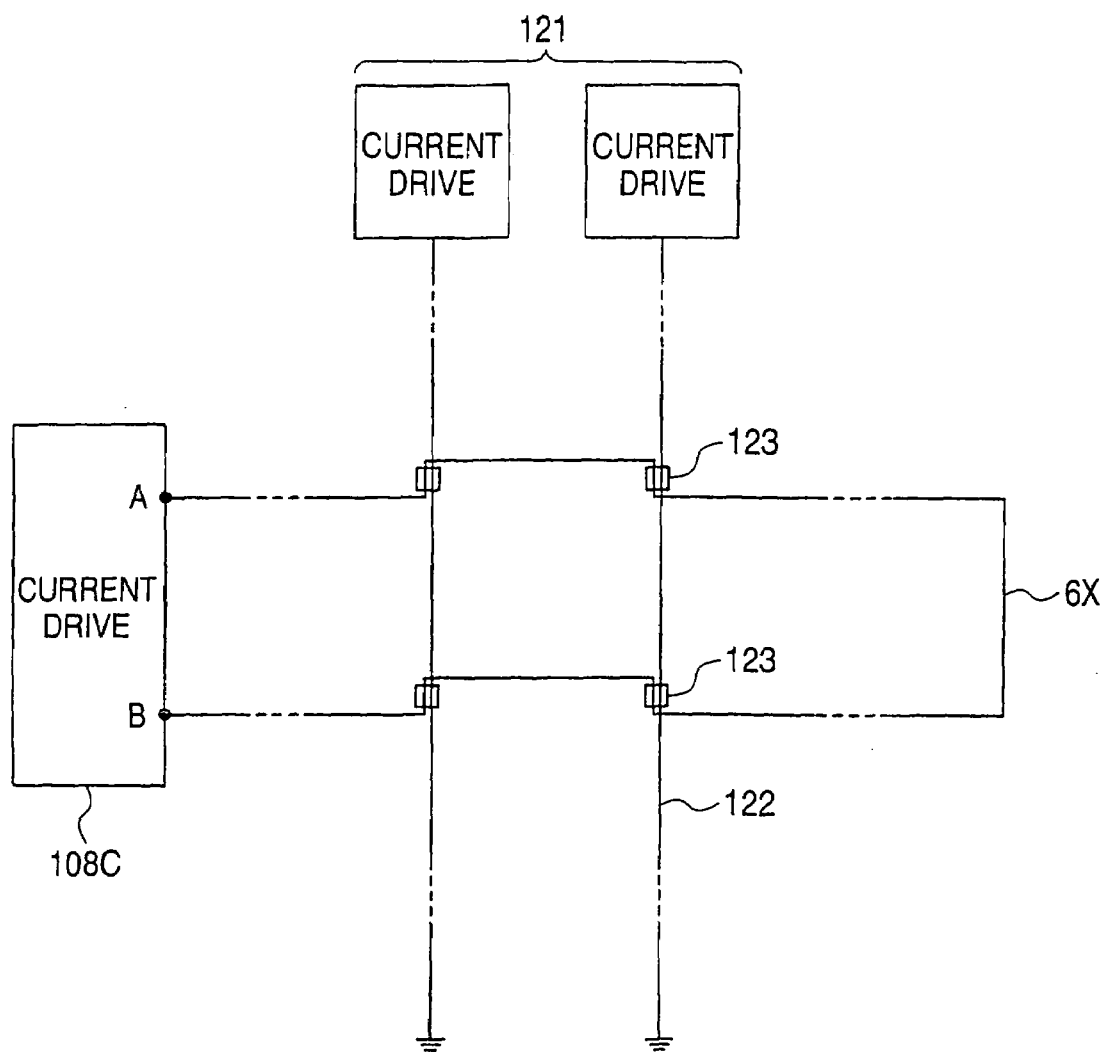
FIG. 25 is a diagram to represent a configuration example of the write circuitry shown in FIG. 3.
Figure 26:
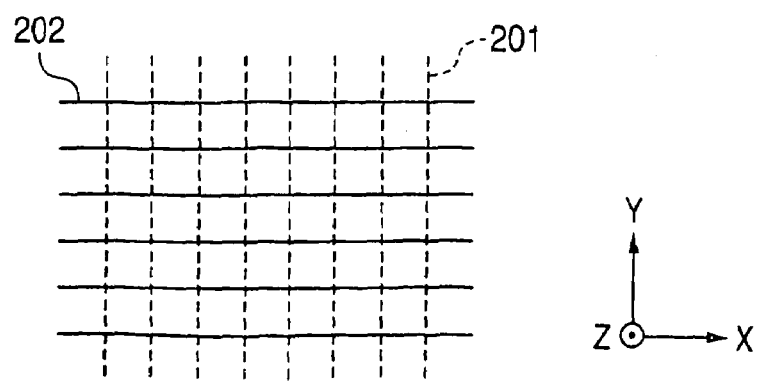
FIG. 26 is a plan view to show the wiring structure of write lines in write circuitry in a related art.
Figure 27:
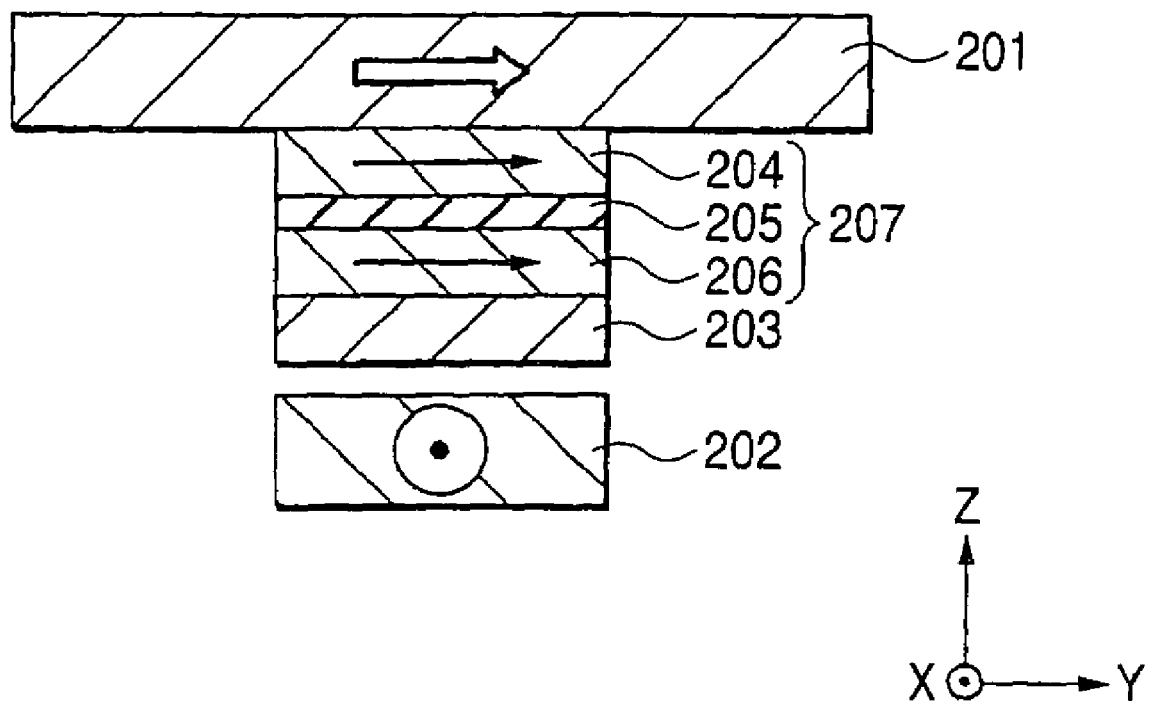
FIG. 27 is a sectional drawing of a storage cell in the write circuitry in the related art.
Figure 28:
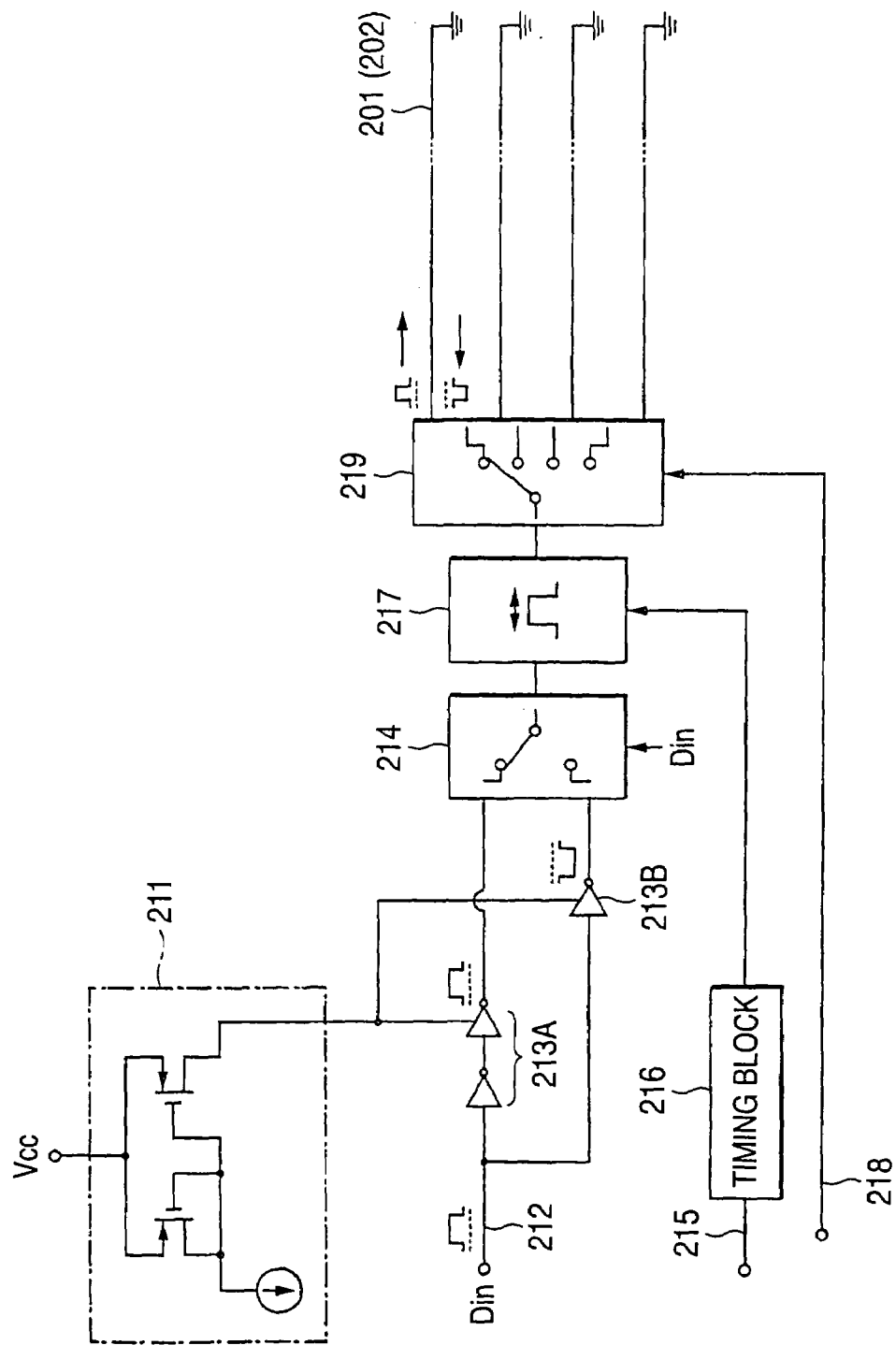
FIG. 28 is a block diagram of a current drive in the write circuitry in the related art.

FIG. 25 shows such a specific example. In this case, X direction write circuitry includes a combination of current drive 108C and write word line 6X wired like a letter U as in the embodiment; Y direction write circuitry includes Y direction current drives 121 configured as in the current supply circuit in the related art and linear write bit lines 122 each connected at one end and grounded at an opposite end.

The write word line 6X is bent in the area crossing the write bit line 122 on both go and return passages, and a magneto-resistance effect element 123 is provided in each cross area. If the magneto-resistance effect elements are thus placed on both the go and return passages of the write word line 6X, the magneto-resistance effect elements can be integrated at a double density. Each of the magneto-resistance effect elements 123 can also be operated so as to bear one-unit information as one storage cell, but a pair of the magneto-resistance effect elements 123 can also be operated as one storage cell (for example, two magneto-resistance effect elements adjacent in the X direction as one storage cell as previously described in the embodiment).

Thus, in the magnetic memory device of the invention, any modifications are possible except that each write line is connected at both ends to the corresponding current drive of the invention. As shown in the specific example, each write line receiving current supply from the corresponding current drive of the invention can be modified so long as the write line is connected at both ends and forms a closed loop, and any wiring shape in the storage cell area may be adopted. For example, the write line need not necessarily be shaped like a letter U; it is also possible to adopt any other wiring structure, such as the case where the write lines cross each other as in the related art as well as the case where the write lines are made parallel with each other in the formation area of the magneto-resistance effect element.

The specific structure of the circuit portion corresponding to the current direction control section and the current amount control section of the current drive of the invention is not limited to that in the embodiment and may be any if the function is embodied, as previously described with the modification examples. In the embodiment, each of the current drives 108C and 106C is made up of the bipolar transistors, but the current drive of the invention is not limited to the configuration and may be made up of semiconductor elements such as MOSFETs or COMSs.

The magneto-resistance effect elements 12A and 12B are paired to form one storage cell 12 for bearing one-unit information, but each element may bear one-unit information. The configuration of the magneto-resistance effect element need not be the same as that described in the embodiment; no toroidal magnetic layer may be provided. Further, in the embodiment, the magneto-resistance effect elements 12A and 12B are TMR elements, but the TMR elements can also be replaced with GMR elements, in which case the element can be made similar to the magneto-resistance effect element 12A (12B) except that the nonmagnetic layer 2 is changed from the insulating layer to a nonmagnetic metal layer. Thus, every known element structure can be applied to the magneto-resistance effect element of the invention; either CPP (Current Perpendicular to the Plane) for allowing a current to flow perpendicularly to the magnetic layer deposition face or CIP (Current Flows in the Plane) for allowing a current to flow in parallel to the magnetic layer deposition face may be adopted.

In the embodiment, the read circuitry is specifically described as the configuration shown in FIG. 9, but the invention is not limited by the circuit configuration, the wiring layout, etc., of the read circuitry.

As described above, the magnetic memory device of the invention includes the magneto-resistance effect element including the magnetic sensitive layer whose magnetization direction changes according to an external magnetic field; the write line to which a write current is supplied to apply an external magnetic field to the magnetic sensitive layer; and the write current drive circuit including the current direction control section for controlling the direction of the write current in the write line and the current amount control section for controlling the amount of the write current in the write line to a constant value. Thus, the write current whose magnitude is always constant independently of the resistance value of the current path can be supplied to the write line in the direction responsive to the information to be written. Therefore, it is made possible to perform the stable write operation independently of resistance value fluctuation for each write line or the like. Since resistance variations of the write lines are allowed, the allowable range of a manufacturing error of the write line can be widened and the flexibility of the write line wiring structure can be enhanced.

Particularly, if the current direction control section includes a first differential switch pair including a first current switch and a second current switch being provided corresponding to both ends of the write line for operating so as to become an opposite open/closed state to each other; and a second differential switch pair including a third current switch and a fourth current switch being provided corresponding to the first current switch and the second current switch for operating so as to become an opposite open/closed state to each other and the first differential switch pair has a function of selecting one of both ends of the write line as the inflow side of the write current and the second differential switch pair has a function of selecting the other as the outflow side of the write current, the current direction control can be embodied by differential control open/closed operation of the paired current switches. The current direction control section is thus implemented using the current switches, whereby it is made possible to configure the write current drive circuit simply with an exceptionally smaller number of elements as compared with the related art.

If the current amount control section is provided on the path of the write current after flowing out from the write line, the write current when it flows into the write line always undergoes constant current control, and the magnitude can always be made constant independently of the resistance value of the current path.

Further, if the first to eighth transistors, the first and second bias resistors, and the first and second current limiting resistors are all integrated in the same area, the paired elements are placed near to each other. Thus, environmental temperature becomes almost equal, varying the mutual characteristics because of temperature change during driving can be prevented, and it is guaranteed that the element pairs perform proper differential operation. Therefore, high-accuracy constant current control is made possible.

The write current drive circuit of the invention includes a pair of connection ends to which both ends of a write line are connected; a current direction control section for controlling the direction of the write current in the write line; and a current amount control section for controlling the amount of the write current allowed to flow into the write line to a constant value. Thus, the write current whose magnitude is always constant independently of the resistance value of the current path can be supplied to the write line in any desired direction. That is, both the direction and the magnitude of the write current can be controlled at the same time and a constant current can always be supplied independently of resistance value fluctuation, etc., for each write line, contributing to the stable write operation.

The write current drive method of the invention includes the steps of selecting one of both ends of the write line as an inflow side of the write current and the other as an outflow side, thereby controlling the direction of the write current; and supplying the write current while controlling so that the write current flows on the write line in a constant current value. Thus, the write current always supplied in a constant amount flows from the one end selected as the inflow side of the write line to the opposite end selected as the outflow side. Therefore, the stable write operation can be performed independently of resistance value fluctuation, etc., for each write line.

What is claimed is:

1. A magnetic memory device comprising:
   a magneto-resistance effect element including a magnetic sensitive layer whose magnetization direction changes according to an external magnetic field;
   a write line to which a write current is supplied to apply the external magnetic field to the magnetic sensitive layer; and
   a write current drive circuit including a current direction control section configured to control the direction of the write current in said write line and a current amount control section configured to control the amount of the write current in said write line to a constant value.

2. The magnetic memory device as claimed in claim 1 wherein the current direction control section is configured to select one of both ends of said write line to which current is to be supplied as an inflow side of the write current and the other as an outflow side, thereby controlling the direction of the write current.

3. The magnetic memory device as claimed in claim 2 wherein the current direction control section is configured to bidirectionally control the direction of the write current in response to an input write data signal.

4. The magnetic memory device as claimed in claim 2, wherein said write line is connected at both ends to the write current drive circuit.

5. The magnetic memory device as claimed in claim 4, wherein said write line has a closed loop shape.

6. The magnetic memory device as claimed in claim 4, wherein the current direction control section comprises:
   a first differential switch pair comprising a first current switch and a second current switch being provided corresponding to both ends of said write line and configured to operate so as to become an opposite open/closed state to each other; and
   a second differential switch pair comprising a third current switch and a fourth current switch being provided corresponding to the first current switch and the second current switch and configured to operate so as to become an opposite open/closed state to each other, and
   wherein the first differential switch pair has a function of selecting one of both ends of said write line as the inflow side of the write current and the second differential switch pair has a function of selecting the other as the outflow side of the write current.

7. The magnetic memory device as claimed in claim 6, wherein the first current switch and the fourth current switch operate so as to become the same open/closed state, and
   wherein the second current switch and the third current switch operate so as to become the opposite open/closed state to that of the first and fourth current switches.

8. The magnetic memory device as claimed in claim 6, wherein at least either the first or second differential switch pair is configured to perform open/closed operation in response to the data signal.

9. The magnetic memory device as claimed in claim 6, wherein both ends of said write line are connected to a pair of joint points between the first and second differential switch pairs.

10. The magnetic memory device as claimed in claim 6, wherein the current direction control section comprises differential control means for controlling so that the first current switch and the fourth current switch become the same open/closed state and the second current switch and the third current switch become the opposite open/closed state to that of the first and fourth current switches.

11. The magnetic memory device as claimed in claim 10 wherein the differential control means detects the open/closed state of one of the first and second differential switch pairs and controls the open/closed operation of the other based on the detection result.

12. The magnetic memory device as claimed in claim 10, wherein the differential control means comprises a fifth current switch and a sixth current switch for operating so as to become the opposite open/closed state to each other.

13. The magnetic memory device as claimed in claim 12, wherein the fifth current switch detects the open/closed state of the third current switch and causes the second current switch to operate so as to become the same open/closed state as the third current switch, and
   wherein the sixth current switch detects the open/closed state of the fourth current switch and causes the first current switch to operate so as to become the same open/closed state as the fourth current switch.

14. The magnetic memory device as claimed in claim 6, wherein the first to fourth current switches are implemented as first to fourth transistors.

15. The magnetic memory device as claimed in claim 12, wherein the first to fourth current switches are implemented as first to fourth transistors.

16. The magnetic memory device as claimed in claim 14, wherein said write line is connected at one end to an emitter of the first transistor and a collector of the third transistor and at an opposite end to an emitter of the second transistor and a collector of the fourth transistor.

17. The magnetic memory device as claimed in claim 16, wherein collectors of the first and second transistors are connected to a power supply.

18. The magnetic memory device as claimed in claim 14, wherein one of the third and fourth transistors of the second differential switch pair has a base to which a write data signal is input and the other has a base to which a signal provided by inverting the data signal is input.

19. The magnetic memory device as claimed in claim 15, wherein the fifth and sixth current switches are implemented as fifth and sixth transistors.

20. The magnetic memory device as claimed in claim 19, wherein the fifth and sixth transistors have bases connected to the collectors of the third and fourth transistors and have collectors to which bases of the second and first transistors are connected.

21. The magnetic memory device as claimed in claim 19, wherein the write current drive circuit comprises a seventh transistor functioning as a switch configured to operate the write current drive circuit and a first current limiting resistor, and wherein the seventh transistor has a collector to which emitters of the fifth and sixth transistors are connected in common and has an emitter grounded through the first current limiting resistor.

22. The magnetic memory device as claimed in claim 19, wherein a first bias resistor is provided between the connection point of the collector of the fifth transistor and the base of the second transistor and a power supply and a second bias resistor is provided between the connection point of the collector of the sixth transistor and the base of the first transistor and the power supply.

23. The magnetic memory device as claimed in claim 22, wherein the first and second transistors have characteristics matched, the third and fourth transistors have characteristics matched, the fifth and sixth transistors have characteristics matched, and the first and second bias resistors have characteristics matched.

24. The magnetic memory device as claimed in claim 1, wherein the current amount control section is provided on the path of the write current flowing out from said write line.

25. The magnetic memory device as claimed in claim 14, wherein the current amount control section comprises at least an eighth transistor and a second current limiting resistor, and wherein the eighth transistor has a collector connected to emitters of the third and fourth transistors in common, has an emitter grounded through the second current limiting resistor, and has a base to which a constant voltage is input selectively.

26. The magnetic memory device as claimed in claim 25 wherein the constant voltage is an active signal for the write current drive circuit and the eighth transistor also functions as a switch for causing the write current drive circuit to operate in response to the active signal.

27. The magnetic memory device as claimed in claim 19, wherein the write current drive circuit comprises a seventh transistor functioning as a switch configured to operate the write current drive circuit and a first current limiting resistor and the seventh transistor has a collector to which emitters of the fifth and sixth transistors are connected in common and has an emitter grounded through the first current limiting resistor, wherein a first bias resistor is provided between the connection point of the collector of the fifth transistor and the base of the second transistor and a power supply and a second bias resistor is provided between the connection point of the collector of the sixth transistor and the base of the first transistor and the power supply, the current amount control section comprises at least an eighth transistor and a second current limiting resistor and the eighth transistor has a collector connected to emitters of the third and fourth transistors in common, has an emitter grounded through the second current limiting resistor, and has a base to which a constant voltage is input selectively, and wherein the first to eighth transistors, the first and second bias resistors, and the first and second current limiting resistors are all integrated in the same area.

28. The magnetic memory device as claimed in claim 1, wherein the magneto-resistance effect element comprises: a layered product comprising the magnetic sensitive layer and configured so that a current flows in a perpendicular direction to the deposition face; and a toroidal magnetic layer being disposed on one face of the layered product so that the direction along the deposition face is an axial direction and penetrated by said write line.

29. The magnetic memory device as claimed in claim 28 wherein said write line comprises a plurality of first write lines and a plurality of second write lines extended so as to cross the plurality of first write lines, and wherein the first and second write lines are extended in parallel with each other in the area penetrating the toroidal magnetic layer.

30. The magnetic memory device as claimed in claim 1, wherein one storage cell comprises a pair of the magneto-resistance effect elements.

31. The magnetic memory device as claimed in claim 30 wherein the magnetization directions of the magnetic sensitive layers in the pair of the magneto-resistance effect elements change so as to become antiparallel with each other according to magnetic fields induced to currents flowing through the first and second write lines and information is stored in the storage cell.

32. A write current drive circuit applied to a magnetic memory device comprising a magneto-resistance effect element comprising a magnetic sensitive layer whose magnetization direction changes according to an external magnetic field and a write line to which a write current is supplied to apply an external magnetic field to the magnetic sensitive layer, said write current drive circuit comprising:

a pair of connection ends to which both ends of the write line are connected;

a current direction control section configured to control the direction of the write current in the write line; and a current amount control section configured to control the amount of the write current allowed to flow into the write line to a constant value.

33. The write current drive circuit as claimed in claim 32 wherein said current direction control section comprises:

a first differential switch pair comprising a first current switch and a second current switch being provided corresponding to both ends of the write line for operating so as to become an opposite open/closed state to each other;

a second differential switch pair comprising a third current switch and a fourth current switch being provided corresponding to the first current switch and the second current switch configured to operate so as to become an opposite open/closed state to each other; and differential control means for controlling so that the first current switch and the fourth current switch become the same open/closed state and the second current switch and the third current switch become the opposite open/closed state to that of the first and fourth current switches.

34. The write current drive circuit as claimed in claim 33, wherein the first to fourth current switches are implemented as first to fourth transistors.

35. The write current drive circuit as claimed in claim 34, wherein the write line is connected at one end to an emitter of the first transistor and a collector of the third transistor and at an opposite end to an emitter of the second transistor and a collector of the fourth transistor.

36. The write current drive circuit as claimed in claim 32, wherein said current amount control section comprises a transistor having a base to which a constant voltage is input and a current limiting resistor and is provided on the path of the write current flowing out from the write line.

37. A write current drive method applied to a magnetic memory device comprising a magneto-resistance effect element comprising a magnetic sensitive layer whose magnetization direction changes according to an external magnetic field and a write line to which a write current is supplied to apply an external magnetic field to the magnetic sensitive layer, said write current drive method comprising the steps of:
   selecting one of both ends of the write line to which current is to be supplied as an inflow side of the write current and the other as an outflow side, thereby controlling the direction of the write current; and
   supplying the write current while controlling so that the write current flows on the write line in a constant current value.

38. The write current drive method as claimed in claim 37 comprising the steps of:
   providing a first differential switch pair comprising a first transistor and a second transistor being provided corresponding to both ends of the write line for operating so as to become an opposite open/closed state to each other;
   providing a second differential switch pair comprising a third transistor and a fourth transistor being provided corresponding to the first transistor and the second transistor for operating so as to become an opposite open/closed state to each other; and
   providing differential control means for controlling so that the first transistor and the fourth transistor become the same open/closed state and the second transistor and the third transistor become the opposite open/closed state to that of the first and fourth transistors;
   connecting the write line at one end to an emitter of the first transistor and a collector of the third transistor and at an opposite end to an emitter of the second transistor and a collector of the fourth transistor;
   bidirectionally switching the direction of the write current allowed to flow into the write line; providing a current amount control section comprising a transistor having a base to which a constant voltage is input and a current limiting resistor on the path of the write current flowing out from the write line; and
   controlling the amount of the write current in the write line to a constant value.

39. The write current drive method as claimed in claim 38, wherein the third and fourth transistors are caused to perform open/closed operation in response to the direction in which the write current is allowed to flow into the write line, whereby the second differential switch pair selects one end of the write line as an outflow side of the write current, wherein
   the differential control means detects the open/closed state of each transistor of the second differential switch pair and controls the operation of the second transistor so as to become the same open/closed state as the third transistor and the operation of the first transistor so as to become the same open/closed state as the fourth transistor, and wherein
   the first and second transistors perform open/closed operation, whereby the first differential switch pair selects the other end of the write line as an inflow side of the write current.

* * * * *